United States Patent
Tsurume

(10) Patent No.: US 7,727,857 B2
(45) Date of Patent: Jun. 1, 2010

(54) MANUFACTURING METHOD OF SEMICONDUCTOR DEVICE

(75) Inventor: Takuya Tsurume, Atsugi (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 679 days.

(21) Appl. No.: 11/588,317

(22) Filed: Oct. 27, 2006

(65) Prior Publication Data

US 2007/0105264 A1   May 10, 2007

(30) Foreign Application Priority Data

Nov. 4, 2005   (JP) .............................. 2005-321525

(51) Int. Cl.
*H01L 21/30* (2006.01)

(52) U.S. Cl. .................. 438/455; 438/107; 438/113; 438/459; 438/460

(58) Field of Classification Search ................. 438/107, 438/113, 455, 459, 460; 257/E21.561
See application file for complete search history.

(56) References Cited

U.S. PATENT DOCUMENTS

| | | | |
|---|---|---|---|
| 5,166,556 A | 11/1992 | Hsu et al. | |
| 5,581,385 A | 12/1996 | Spitzer et al. | |
| 5,757,456 A | 5/1998 | Yamazaki et al. | |
| 6,022,792 A | 2/2000 | Ishii et al. | |
| 6,646,711 B2 | 11/2003 | Sugano | |
| 6,682,963 B2 | 1/2004 | Ishikawa | |
| 7,084,045 B2 | 8/2006 | Takayama et al. | |
| 7,105,448 B2 | 9/2006 | Takayama et al. | |
| 2003/0082889 A1 | 5/2003 | Maruyama et al. | |
| 2004/0164302 A1 | 8/2004 | Arai et al. | |
| 2004/0212012 A1 | 10/2004 | Yamazaki et al. | |
| 2004/0232459 A1 | 11/2004 | Takayama et al. | |
| 2005/0130389 A1 | 6/2005 | Yamazaki et al. | |
| 2006/0011288 A1 | 1/2006 | Watanabe et al. | |
| 2006/0068536 A1 | 3/2006 | Yamazaki | |
| 2006/0099738 A1 | 5/2006 | Yamazaki | |
| 2006/0110863 A1 | 5/2006 | Yamamoto et al. | |
| 2006/0194371 A1 | 8/2006 | Okazaki et al. | |
| 2008/0073752 A1* | 3/2008 | Asai et al. .................... 257/615 |

FOREIGN PATENT DOCUMENTS

| | | |
|---|---|---|
| EP | 1 453 088 | 9/2004 |
| JP | 2004-282050 | 10/2004 |
| WO | WO 2006/006611 | 1/2006 |

* cited by examiner

*Primary Examiner*—Jack Chen
(74) *Attorney, Agent, or Firm*—Eric J. Robinson; Robinson Intellectual Property Law Office, P.C.

(57) ABSTRACT

To provide a thin semiconductor device having flexibility. A groove is formed in one surface of a substrate; an element layer including an element is formed, the element being disposed within the groove; the substrate is thinned from the other surface of the substrate until one surface of the element layer is exposed, to form a layer which is to be transposed, having the element; and the layer to be transposed is transposed onto the film.

13 Claims, 16 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device. In particular, the present invention relates to a manufacturing method of a semiconductor device capable of exchanging data with wireless communication.

2. Description of the Related Art

In recent years, a semiconductor device capable of exchanging data with wireless communication has been actively developed. Such a semiconductor device is called an IC tag, an ID tag, an RF (Radio Frequency) tag, an RFID (Radio Frequency Identification) tag, a wireless tag, an electronic tag, a wireless processor, a wireless memory, a wireless chip, or the like.

Wireless chips which have been put into practical use mainly use a silicon substrate (wafer). In addition, manufacturing of a thin wireless chip by using a technology (referred to as a "backgrind technology") of grinding and polishing a surface (a reverse side) of a silicon substrate has been recently studied. It is known that the backgrind technology causes a crack or a grinding mark (e.g., Reference 1: Japanese Published Patent Application No. 2004-282050).

For thinning a wireless chip to the utmost, it is necessary to grind and polish a substrate as much as possible. However, if the substrate with a thickness smaller than a certain thickness is polished, strength of the substrate cannot be maintained, which may result in destruction of the substrate itself and eventually of an element formed over the substrate.

SUMMARY OF THE INVENTION

In view of the foregoing, it is an object of the invention to provide a thin semiconductor device having flexibility.

One manufacturing method of a semiconductor device of the invention includes the following steps: a groove is formed in one surface of a substrate; an element layer is formed including an element, the element being disposed within the groove; the substrate is thinned (ground and polished) from the other surface of the substrate until a surface of the element layer is exposed, to form a layer which is to be transposed, having the element; and one surface of the layer to be transposed is attached to a film, thereby the layer to be transposed is transposed onto the film.

One manufacturing method of a semiconductor device of the invention includes the following steps: a groove is formed in one surface of a substrate; an element layer is formed including an element, the element being disposed within the groove; the substrate is thinned (ground and polished) from the other surface of the substrate until a surface of the element layer is exposed, to form a layer which is to be transposed, having the element; one surface of the layer to be transposed is attached to a first film, thereby the layer to be transposed is transposed onto the first film; a second film is attached to the other surface of the layer to be transposed (i.e. a second film is laminated on the first film so that the element is interposed between the first film and the second film); and the first film and the second film are cut, to form a semiconductor device having the element.

One manufacturing method of a semiconductor device of the invention includes the following steps: a groove is formed in one surface of a substrate; an element layer is formed including an element, the element being disposed within the groove; a first film is attached to the element layer by using a substrate-fixing jig; the substrate-fixing jig is installed in an adsorption jig; the substrate is thinning (ground and polished) from the other surface of the substrate until a surface of the element layer is exposed, to form a layer which is to be transposed, having the element; an adhesibility between the first film and the layer to be transposed is selectively reduced, and a second film is attached to one surface of the layer to be transposed, thereby the layer to be transposed is transposed onto the second film; a third film is attached to the other surface of the layer to be transposed (i.e. a third film is laminated on the second film so that the element is interposed between the second film and the third film); and the second film and the third film are cut, to form a semiconductor device having the element.

One manufacturing method of a semiconductor device of the invention includes the following steps: a groove is formed in one surface of a substrate; an element layer including an element, the element being disposed within the groove; a film is attached to the element layer by using a substrate-fixing jig; the substrate-fixing jig is installed in an adsorption jig; the substrate is thinned (ground and polished) from the other surface of the substrate until a surface of the element layer is exposed, to form a layer which is to be transposed, having the element; and the film is cut, to form a semiconductor device having the element.

In addition, the layer to be transposed has an antenna in the above-described structure.

One manufacturing method of a semiconductor device of the invention includes the following steps: a plurality of grooves are formed in one surface of a substrate; an element layer including a plurality of elements which are disposed within the plurality of grooves is formed; the substrate is thinned (ground and polished) from the other surface of the substrate until a surface of the element layer is exposed, to form a plurality of layers which are to be transposed, each having at least one of the plurality of elements; a film is attached to one surface of the plurality of layers which are to be transposed, thereby the plurality of layers which are to be transposed are transposed onto the film; the film is cut such that the plurality of layers which are to be transposed are separated from each other; and each of the plurality of cut layers to be transposed and each of plurality of a base member provided with an antenna are attached to each other so that each of the plurality of elements and each of the antennas are electrically connected to each other.

In addition, depth of the groove is within the range of 2 μm to 100 μm inclusive, in the above-described structure.

In addition, an opening portion of the groove is square in shape in the above-described structure.

In addition, length per side of the square is within the range of 0.5 mm to 25 mm inclusive, in the above-described structure.

In addition, a glass substrate or a silicon substrate is used as the substrate in the above-described structure.

In addition, the polishing is physical polishing in the above-described structure.

In the present invention, a groove with a predetermined size is formed in one surface of a substrate, and an element layer is formed such that an element is disposed within a region where the groove is provided. That is, as well as the element is disposed in the groove portion, there is a part of the substrate adjacent to a side surface of the element. Because of the part of the substrate which exists adjacent to the side surface of the element as above, element destruction can be suppressed even if the substrate is thinned to the utmost by grinding and polishing the other surface of the substrate until one surface of the element layer (a bottom surface of the groove) is exposed. By using the present invention, a semiconductor device which is thinner than a conventional one can be provided.

DETAILED DESCRIPTION OF THE INVENTION

Figure 1:
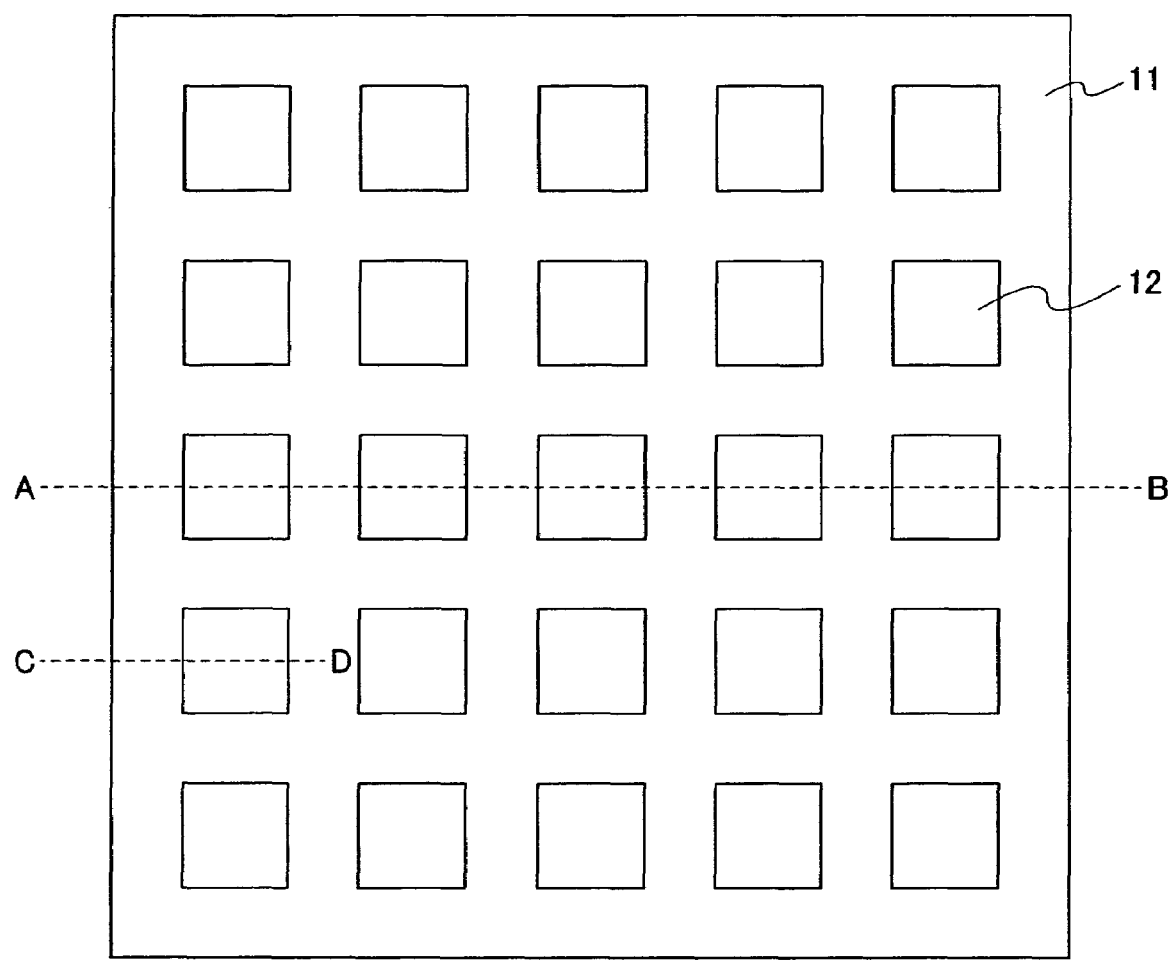
FIG. 1 shows a manufacturing method of a semiconductor device of the invention (Embodiment Mode 1).

Although the invention will be fully described by way of embodiment modes with reference to the accompanying drawings, it is to be understood that various changes and modifications will be apparent to those skilled in the art. Therefore, unless such changes and modifications depart from the scope of the invention, they should be construed as being included therein. Note that the same portions are denoted by the same reference numerals in the drawings in a structure of the invention described hereinafter.

In addition, various conditions of materials, numerical values, and the like described hereinafter in this specification are merely conditions of materials and numerical values of an object which is intended to be formed; it is easily understood by those skilled in the art that a slight difference may occur in an element composition or a physical property value of an object that is actually formed. In addition, it is also easily understood by those skilled in the art that a result itself measured by various analyzing methods generally includes a slight difference. Therefore, the present invention should not be interpreted as being limited to description of the embodiment modes to be given below; a slight different materials and numerical values from materials and numerical values which are described in this specification are also regarded as being included in the scope of the invention.

Embodiment Mode 1

In this embodiment mode, one structure of a manufacturing method of a semiconductor device of the invention will be described using the drawings.

Figure 2A:
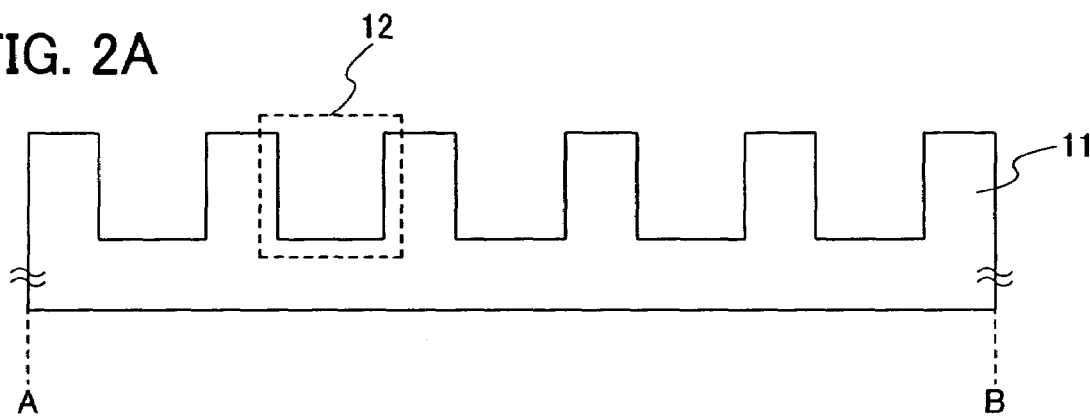
FIGS. 2A to 2C show a manufacturing method of a semiconductor device of the invention (Embodiment Mode 1).

First, a groove 12 with a predetermined size is formed in one surface of a substrate 11. A top view of the substrate 11 where the groove 12 is formed is FIG. 1, and a cross-sectional view along line A-B in FIG. 1 is FIG. 2A. Although the substrate 11 in which the number of the grooves 12 is 25 is shown in the top view of FIG. 1, the number of the grooves 12 to be provided is not limited to this. That is, the number of the grooves 12 formed in the substrate 11 is not limited to 25, and either only one groove or a plurality of grooves may be formed.

In this embodiment mode, the groove 12 is formed using a laser. The groove 12 may also be formed using a means other than a laser. The shape of the groove 12 when seen from above the substrate 11 can be determined arbitrarily considering the shape of an element which is to be formed later or the like, and is, for example, rectangular, square, or circular. Further, a side surface of the groove 12 may be perpendicular to the substrate 11, or may be formed to be a tapered shape, but preferably may be formed to be a reverse-tapered shape (the shape where the width gets larger conically as the depth of the groove 12 gets larger). If the side surface of the groove 12 is formed to be a reverse-tapered shape, a base film which is to be formed in a later step or an insulating film which is a part of an element layer is hard to form at the side surface of the groove 12; therefore, a layer to be transposed, which is formed inside the groove 12 in a later step can be easily and selectively transposed.

In addition, size of the groove 12 can be arbitrarily determined such that at least an element which is to be formed later can be formed within the groove 12. For example, depth of the groove 12 may be set within the range of 2 μm to 100 μm inclusive, and length per side in the case where the groove 12 is a square may be set within the range of 0.5 mm to 25 mm inclusive. It is needless to say that the depth of the groove 12 is required to be smaller than the thickness of the substrate 11. A phrase "one surface of the substrate 11" in this specification refers to a surface on a side where the groove 12 is provided.

As the substrate 11, a glass substrate, a quartz substrate, a silicon substrate, a metal substrate (e.g., a stainless substrate), a ceramic substrate, a plastic substrate (e.g., an acrylic substrate), or the like can be used; preferably a glass substrate is used. A glass substrate is not limited so much in area and shape. Therefore, a rectangular substrate with at least one meter or more on a side can be easily used if a glass substrate is used as the substrate 11, thereby productivity can be drastically improved. This is a great advantage as compared to the case of using a circular silicon substrate. Further, as for the cost of a substrate itself, it is preferable to use a glass substrate rather than a quartz substrate, a silicon substrate, a metal substrate (e.g., a stainless substrate), a ceramic substrate, or the like. In particular, when a large substrate is required, the superiority in low cost is so remarkable that a glass substrate is preferable also in consideration of mass productivity. In this embodiment mode, a glass substrate is used as the substrate 11.

In addition, the case where a silicon substrate is used as the substrate 11 is effective in miniaturizing an element, namely highly-integrating. For example, a transistor with a gate length of 0.5 µm or less can be formed and driven by a low voltage.

In addition, thickness of the substrate 11 is not particularly limited; for example, a substrate with a thickness of 0.3 mm to 1 mm inclusive (more specifically, 0.5 mm) may be used.

Figure 2B:
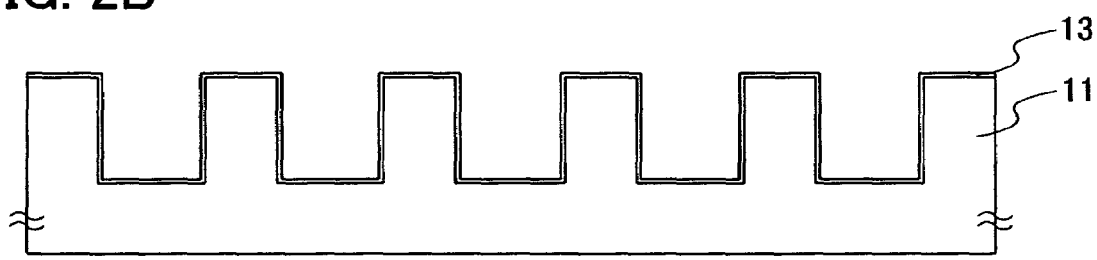

Next, a base film 13 is formed over the one surface of the substrate 11 where the groove 12 is formed (FIG. 2B). In the case where a glass substrate is used as the substrate 11, providing the base film 13 can prevent movable ions such as sodium contained in the glass substrate from entering an element layer which is to be formed later. Note that the base film 13 is not necessarily provided, such as in the case where a bottom-gate thin-film transistor is used as an element provided inside the element layer which is to be formed later. The base film 13 is not also necessarily provided in the case where a silicon substrate is used as the substrate 11.

Further, it is more preferable to provide a protection film between the substrate 11 and the base film 13, as a stopper layer in polishing the other surface of the substrate 11 later. Providing the protection film can prevent that the base film 13 or the element layer which is to be formed later is polished by mistake. As the protection film, a layer containing carbon such as DLC (Diamond-Like Carbon) which is formed by CVD or sputtering can be used. Alternatively, the protection film may be formed on a surface of the substrate 11 by performing high-density plasma treatment in an atmosphere containing nitrogen to the one surface of the substrate 11.

In this specification, "high-density plasma treatment" is characterized in that the electron density of plasma is $1 \times 10^{11}$ cm$^{-3}$ to $1 \times 10^{13}$ cm$^{-3}$ inclusive and the electron temperature of plasma is 0.5 eV to 1.5 eV inclusive. Hereinafter, only "high-density plasma treatment" described in this specification means plasma treatment in the above-mentioned condition. Although the electron density of plasma is high, the electron temperature around the substrate 11 is low; thus plasma damage to the substrate 11 can be prevented. In addition, the potential of plasma is as low as 5 V or less, thus excessive dissociation of material molecules can be suppressed. As the power source frequency for generating plasma, a microwave (2.45 GHz) is used.

As the atmosphere containing nitrogen, a mixed gas of nitrogen ($N_2$) or ammonia ($NH_3$) and a rare gas, or a mixed gas of nitrogen ($N_2$) or ammonia ($NH_3$), a rare gas, and hydrogen ($H_2$) can be used. The other surface of the substrate 11 can be nitrided by nitrogen radicals (which may contain NH radicals) generated by high-density plasma.

The base film 13 may have either a single-layer structure or a multi-layer structure. As a material of the base film, a silicon oxide film, a silicon nitride film, a silicon oxide film containing nitrogen (a $SiO_xN_y$ film) (x>y, x and y are positive integers), a silicon nitride film containing oxygen (a $SiN_xO_y$ film) (x>y, x and y are positive integers), or the like can be formed by sputtering, plasma CVD, or the like. For example, in the case where the base film has a two-layer structure, a silicon nitride film containing oxygen may be used as a first insulating film, and a silicon oxide film containing nitrogen may be used as a second insulating film.

Figure 2C:
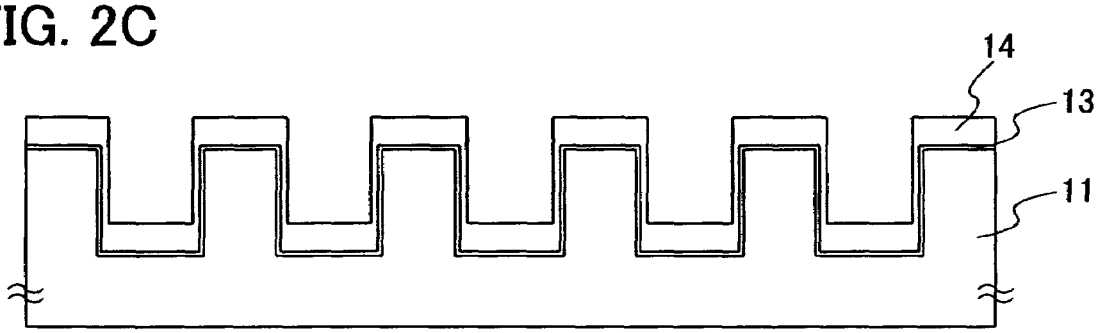

Next, a layer 14 having an element such as a thin film transistor (hereinafter referred to as an "element layer 14") is formed over the one surface of the substrate 11 where the groove 12 is formed (FIG. 2C). At this time, the element layer 14 is formed such that the element is disposed within a region where the groove 12 is formed. That is, as well as the element is disposed within the region where the groove 12 is formed, there is a part of the substrate adjacent to a side surface of the element. This part of the substrate 11 serves to maintain the strength in grinding and polishing the substrate 11 later and prevent destruction of the element.

The element layer 14 at least includes an element typified by a thin film transistor (TFT), a diode, a resistor, or the like and by using such an element, a variety of integrated circuits such as a CPU, a memory, and a microprocessor can be formed. In addition, the element layer 14 can have a mode including an antenna in addition to the element. For example, an integrated circuit constituted from a thin film transistor operates by using alternating voltage generated in an antenna and can perform transmission to a reader/writer by modulating alternating voltage to be applied to the antenna. Note that the antenna may be formed inside the element layer as described above, or the element formed inside the element layer and the antenna may be electrically connected to each other by attaching the substrate provided with the element layer and another substrate provided with the antenna to each other.

Figure 3A:
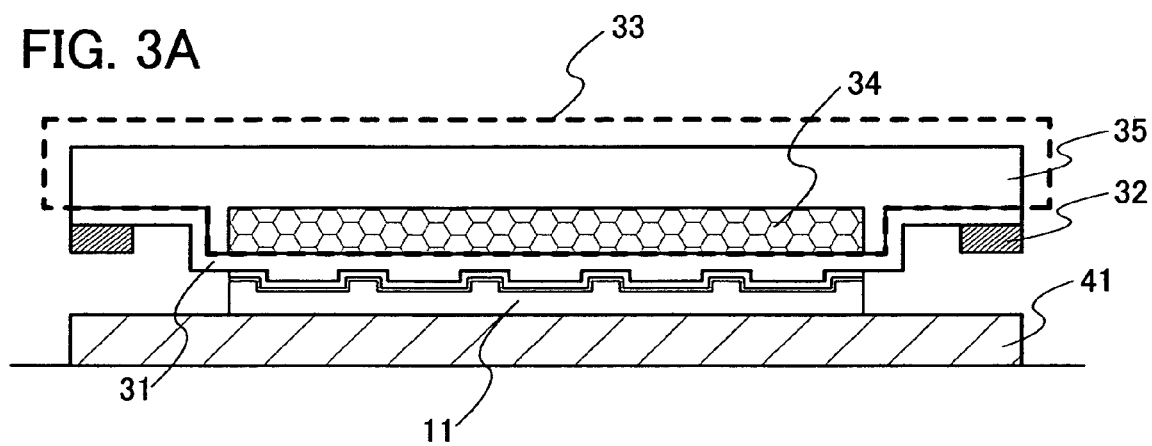
FIGS. 3A and 3B show a manufacturing method of a semiconductor device of the invention (Embodiment Mode 1).

Next, a film 31 is provided so as to cover the element layer 14, and the film 31 is connected to a substrate-fixing jig (a frame) 32 (FIG. 3A). The film 31 serves to fix the substrate when grinding and polishing the substrate, and to protect the one surface of the element layer 14.

The film 31 preferably has a high adhesivity in a normal state and has a low adhesivity weakened when being irradiated with light. For example, a UV tape, adhesivity of which weakens when being irradiated with ultraviolet light, may be used. Further, a film (a heat peeling tape) having a property such that the adhesivity becomes weak by heating may also be used. Further alternatively, a film in which a film for protecting the element layer 14 and an UV tape or a heat peeling tape are stacked may be used; in that case, the UV tape or the heat peeling tape is in contact with the element layer 14.

Next, the substrate-fixing jig (frame) 32 to which the substrate 11 is attached by the film 31 is installed in an adsorption jig 33. At this time, the film 31 is provided such that the one surface of the substrate 11 (the surface on a side where the film 31 is provided) is lower than one surface of the substrate-fixing jig 32, in order to prevent the substrate-fixing jig 32 itself from grinding and polishing. The adsorption jig 33 is, for example, constituted from a porous chuck 34 and a stage 35. The porous chuck 34 is formed of a porous material and has a vacuum chuck mechanism.

Next, the substrate 11 is thinned by grinding the other surface of the substrate 11 with a grinding means 41; at this time, the substrate 11 is ground until the thickness becomes 200 µm or less. In general, in this grinding step, one or both of the adsorption jig 33 to which the substrate 11 is fixed and the grinding means 41 is rotated to grind the other surface of the substrate 11. The grinding means 41 corresponds to, for example, a grindstone. In this specification, "the other surface of the substrate 11" refers to a surface opposite to the surface on a side provided with the element layer 14, or refers to a surface on a side which is ground by the grinding means 41. Note that cleaning may be conducted if necessary in order to remove dust generated in the grinding step. In that case, water droplets generated in the cleaning are removed by drying naturally or by using a drying means. Specifically as the drying means, there is a method of rotating the substrate 11, a method of blowing a gas such as air (atmospheric air) to the substrate 11 with a blower, or the like.

Figure 3B:
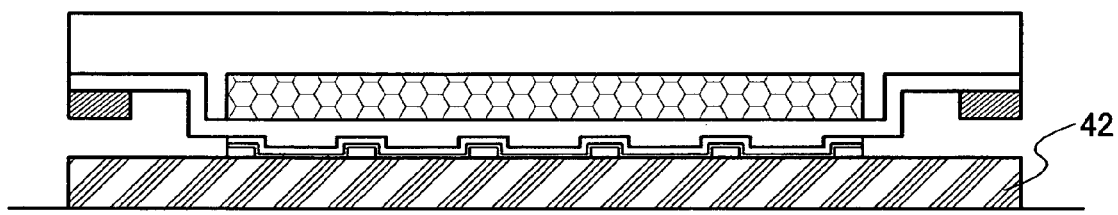

Subsequently, the other surface of the substrate 11, which has been ground, is polished by a polishing means 42 (FIG. 3B). At this time, the other surface is polished until a bottom surface of the groove 12 (i.e., a bottom surface of the base film 13) is exposed. That is, a part of the substrate exists adjacent to a side surface of the element disposed within a region where the groove 12 is formed, whereas the substrate 11 does not exist under the element disposed within the region where the groove 12 is formed. By polishing the substrate 11 so as not to leave the substrate 11 under the element, the thickness of a semiconductor device having the element can be small. In the case where a silicon substrate is used as the substrate 11, the polishing may be carried out such that an element forming region (a portion under the groove 12) has a thickness of 0.1 µm to 30 µm, preferably 1 µm to 5 µm.

This polishing step is carried out, in the same way as the above-described grinding step, by rotating one or both of the adsorption jig 33 to which the substrate 11 is fixed and the polishing means 42, to polish the other surface of the substrate 11. The polishing means 42 corresponds to, for example, a polishing pad to which polishing grains are applied. Note that cleaning may be conducted if necessary in order to remove dust generated in the polishing step. In that case, water droplets generated in the cleaning are removed by drying naturally or by using a drying means. Specifically as the drying means, there is a method of rotating the substrate 11, a method of blowing a gas such as air (atmosphere) to the substrate 11 with a blower, or the like.

Figure 4A:
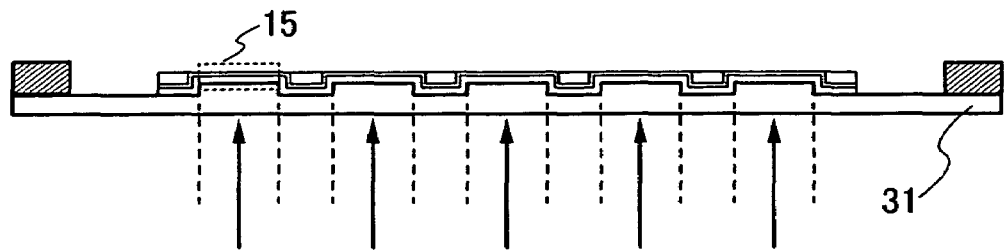
FIGS. 4A to 4D show a manufacturing method of a semiconductor device of the invention (Embodiment Mode 1).

Next, the adhesibility of the film 31 is selectively reduced in a region 15 where the base film 13, which has been exposed by polishing the substrate 11, and the element layer 14 are formed (FIG. 4A). A region (a region surrounded by a dotted line in FIG. 4A) of the base film 13, which has been exposed by polishing the substrate 11, and the element layer 14 is transposed in a later step, thus the region is referred to as a "layer to be transposed 15" hereinafter in this specification. As one example of a specific means for selectively reducing the adhesibility of the film 31, the region which is in contact with the layer to be transposed 15 is irradiated with an ultraviolet ray in the case where an UV tape is used as the film 31. In the case where a heat peeling tape is used as the film 31, heat is selectively applied to the region which is in contact with the layer to be transposed 15.

Figure 4B:
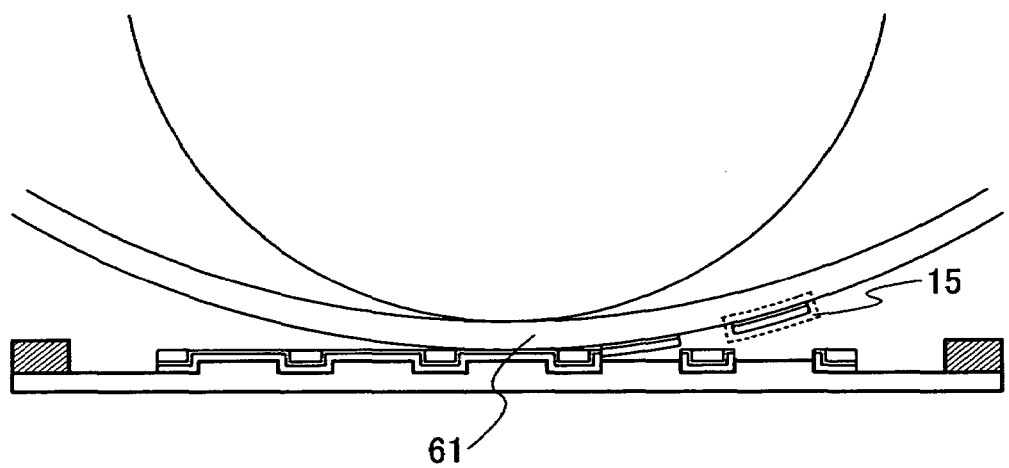

Next, a first laminated film 61 (also called a "laminate film") is attached to one surface of the layer to be transposed 15 (i.e., the base film 13 which has been exposed by polishing the substrate 11), thereby the layer to be transposed 15 is transposed from the film 31 (FIG. 4B). By performing this transposition, the one surface of the layer to be transposed 15 can be protected by the first laminated film 61. This transposing step is carried out using a laminating device (hereinafter referred to as a "laminate device"); the laminate device has a first roll provided with one or both of a heating means and a pressure-applying means, and a second roll around which the first laminated film 61 is twisted to supply the first laminated film 61 to the first roll.

It is important for the above-described transposing step that the layer to be transposed 15 is selectively transposed onto the first laminated film 61 whereas the other region than the layer to be transposed 15 is not transposed. As the method for transposing the layer to be transposed 15 selectively onto the first laminated film 61, the following two methods are described: the first method is a method in which one or both of heating and pressure-applying is carried out selectively to the other surface of the layer to be transposed 15, thereby selectively attaching to the first laminated film 61; and the second method is a method in which a film having adhesiveness only in a portion which is in contact with the layer to be transposed 15 but in a portion which is in contact with the other region except the layer to be transposed 15 is used as the first laminated film 61.

Figure 4C:
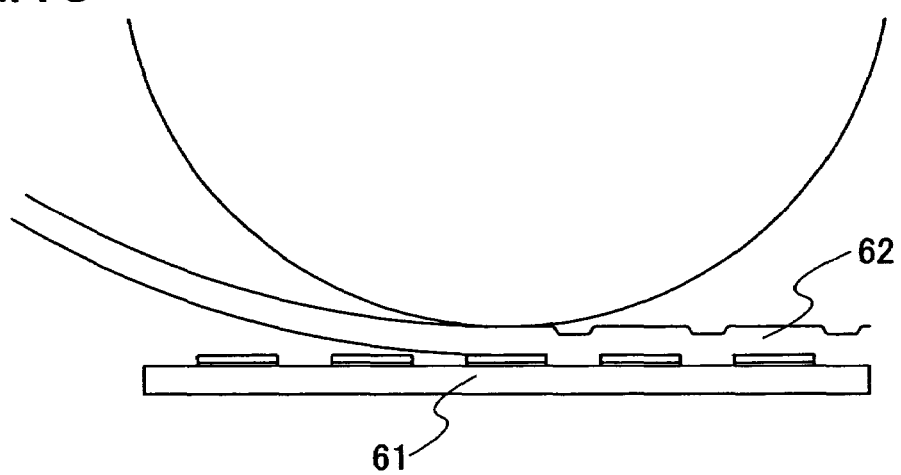

Next, a second laminated film 62 is attached to the other surface of the layer to be transposed 15 as necessary, thereby sealing the layer to be transposed 15 (FIG. 4C). This step can be carried out using the above-mentioned laminate device.

Each of the first laminated film 61 and the second laminated film 62 used in transposing or sealing has at least a base member and an adhesive layer. The base member may be provided in plural number; in that case, a structure in which an adhesive layer is further included between the base members can also be used.

As the base member, a film which is subjected to antistatic treatment (an antistatic film), a film having moisture permeable-resistance (water vapor barrier properties), a film made of polyamide, polypropylene, polyester, vinyl, polyvinyl fluoride, vinyl chloride, or an inorganic-deposited film, paper of a fibrous material, or the like can be used. As the adhesive layer, a layer containing an adhesive such as a heat curing resin, an ultraviolet curing resin, an acrylic resin-based adhesive, an epoxy resin-based adhesive, or a resin additive can be used.

As the film which is subjected to antistatic treatment, a film formed by dispersing an antistatic material in a resin, a film to which an antistatic material is attached, or the like can be given. The film to which the antistatic material is attached may be a film, only one side of which is provided with the antistatic material, or may be a film, both sides of which are provided with the antistatic material. The film in which only one side is provided with the antistatic material may have a structure in which the side provided with the antistatic material is attached so as to be inside of the film or outside of the film. The antistatic material may be attached over an entire surface of the film or a part of the film. As the antistatic material, metal such as aluminum, oxide containing indium and tin (ITO), an amphoteric surfactant metal salt, an imidazoline amphoteric surfactant, a resin material containing a cross-linking copolymer having a carboxyl group and a quaternary ammonium base in side chains, or the like can be used. Using partially the antistatic film as the first laminated film 61 or the second laminated film 62, an adverse effect to the integrated circuit by external static electricity can be prevented.

The first laminated film 61 and the second laminated film 62 are attached to the layer to be transposed 15 by heat treatment and pressure treatment. The heat treatment and pressure treatment are performed as follows: an adhesive layer which is provided in the outermost surface of the laminated film is melted by heart treatment, and then pressure is applied to attach. It is to be noted that if a method (heat welding) of melting the base member by heat treatment is adopted, a single-layer film formed of the base member can also be used instead of each of the first laminated film 61 and the second laminated film 62.

In order to prevent penetration of moisture and the like into the layer to be transposed 15 after sealing, respective surfaces of the first laminated film 61 and the second laminated film 62 are preferably subjected to silica coating. In this specification, "silica coating" refers to coating with silicon dioxide (silica) powder to be performed on a surface of an object to be processed; however, the same effect can be obtained even when powder of either silicon nitride containing oxygen or silicon oxide containing nitrogen is used instead of the silicon dioxide powder.

Figure 4D:
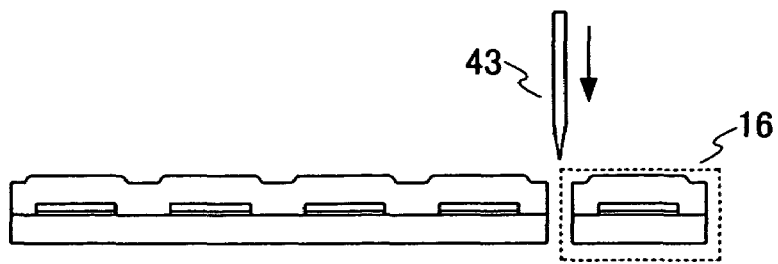

Then, the first laminated film 61 and the second laminated film 62 are cut by a cutting means 43 (FIG. 4D). The cutting means 43 corresponds to a dicer, a laser, a wire saw, a cutter, or the like. A laser is preferably used as the cutting means 43 in the case where each of the first laminated film 61 and the second laminated film 62 is formed of a base member and an adhesive layer. This is because a structure in which the adhesive layers are sealed with the first base member and the second base member can be obtained at the same time as cutting, by arbitrarily setting the laser condition. Through the above-described steps, a semiconductor device (a wireless chip) 16 including the layer to be transposed is completed.

The description in this embodiment mode is made of the semiconductor device having the structure in which both sides of the layer to be transposed 15 are protected by the first laminated film 61 and the second laminated film 62, considering long-term reliability of the semiconductor device; however, the first laminated film 61 and the second laminated film 62 are not necessarily attached to the layer to be transposed 15. That is, after the above-described polishing step (FIG. 3B), the film 31 may be detached from the adsorption jig 33, and the film 31 may be cut along a side surface of the layer to be transposed 15, thereby manufacturing a semiconductor device. Note that this cutting may be performed using a dicer, a laser, a wire saw, a cutter, or the like.

As described above, in the present invention, the layer to be transposed 15 is formed in the groove 12 which is formed in the substrate 11, the substrate is ground and polished until a bottom surface of the groove 12 (i.e., a bottom surface of the base film 13) is exposed, and the layer to be transposed 15 is transposed to form a semiconductor device. By using the invention as above, a semiconductor device which is thinner than a conventional one can be provided.

Embodiment Mode 2

In this embodiment mode, a manufacturing method of a semiconductor device in which an antenna is provided inside a layer to be transposed will be described. Respective elements formed in a plurality of grooves have the same structure, thus description will be made focusing on an integrated circuit (an element) formed in one groove in this embodiment mode.

First, the groove 12 with a predetermined size is formed in one surface of the substrate 11 (FIG. 1). Although the substrate 11 in which the number of the grooves 12 is 25 is shown in a top view of FIG. 1, the invention is not limited to this. That is, the number of the grooves 12 formed in the substrate 11 is not limited to 25, and either only one groove or a plurality of grooves may be formed.

Figure 5A:
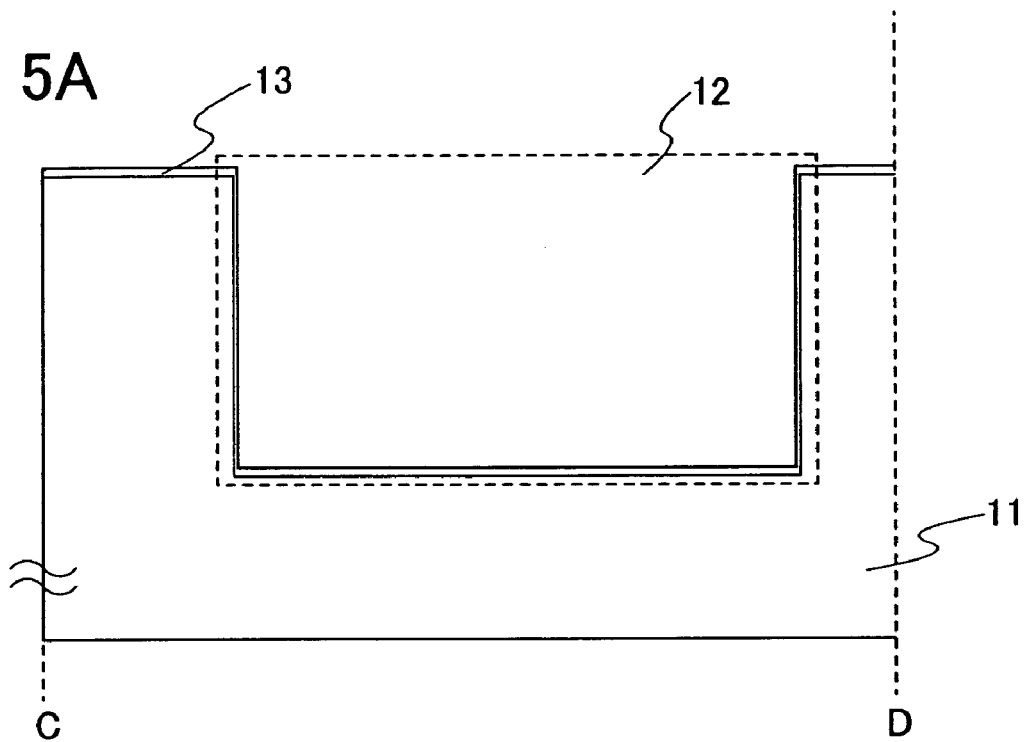
FIGS. 5A and 5B show a manufacturing method of a semiconductor device of the invention (Embodiment Mode 2).
Figure 5B:
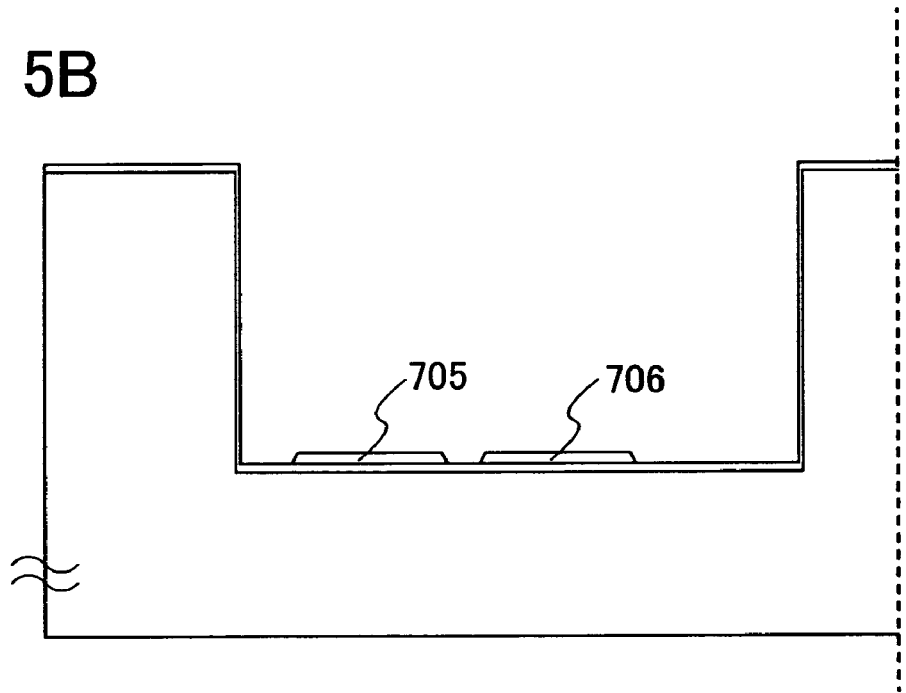

Cross-sectional views along line C-D in FIG. 1 are FIGS. 5A and 5B. In this embodiment mode, the groove 12 is formed using a laser. The groove 12 may also be formed using a means other than a laser. The shape of the groove 12 can be determined arbitrarily considering the shape of an element which is to be formed later or the like, and is, for example, rectangular, square, or circular. Further, a side surface of the groove 12 may be perpendicular to the substrate 11, or may be formed to be a tapered shape, but preferably may be formed to be a reverse-tapered shape (the shape where the width gets larger conically as the depth of the groove 12 gets larger). If the side surface of the groove 12 is formed to be a reverse-tapered shape, a base film which is to be formed in a later step or an insulating film which is a part of an element layer is hard to form at the side surface of the groove 12; therefore, a layer to be transposed, which is formed inside the groove 12 in a later step can easily and selectively be transposed.

In addition, size of the groove 12 can be arbitrarily determined such that at least an element which is to be formed later can be formed within the groove 12. For example, depth of the groove 12 may be set within the range of 2 μm to 100 μm inclusive, and length per side in the case where the groove 12 is a square may be set within the range of 0.5 mm to 25 mm inclusive. It is needless to say that the depth of the groove 12 is required to be smaller than the thickness of the substrate 11. A phrase "one surface of the substrate 11" in this specification refers to a surface on a side where the groove 12 is provided.

Next, the base film 13 is formed over the one surface of the substrate 11 where the groove 12 is formed (FIG. 5A). The material and forming method of the base film 13 are the same as those described in Embodiment Mode 1, thus description thereof is omitted here. A step of forming an element layer over the base film 13 will be described below.

First, an amorphous semiconductor film (e.g., a film containing amorphous silicon as a main constituent) is formed over the base film 13. The amorphous semiconductor film is formed by sputtering or any type of CVD such as plasma CVD with a thickness of 25 nm to 200 nm (preferably 30 nm to 150 nm). Subsequently, the amorphous semiconductor film is crystallized to form a crystalline semiconductor film. As a crystallization method thereof, laser crystallization, thermal crystallization using RTA or an annealing furnace, thermal crystallization using a metal element for promoting crystallization, a method in which thermal crystallization using a metal element for promoting crystallization and laser crystallization are combined, or the like can be used. Then, the obtained crystalline semiconductor film is etched into a desired shape so that crystalline semiconductor films 705 and 706 are formed (FIG. 5B). Note that each of the crystalline semiconductor films 705 and 706 which is used as an active layer of a thin film transistor used as an element is formed so as to be provided in the bottom surface of the groove 12. The base film 13 and the amorphous semiconductor films can also be successively formed without being exposed to atmospheric air.

An example of a manufacturing process of the crystalline semiconductor films 705 and 706 will be described below. As a method for crystallizing an amorphous semiconductor film, there is laser crystallization, thermal crystallization using RTA or an annealing furnace, thermal crystallization using a metal element for promoting crystallization, a method in which thermal crystallization using a metal element for promoting crystallization and laser crystallization are combined, or the like. Further, as another crystallization method, crystallization may be performed by generating thermal plasma by applying DC bias and making the thermal plasma affect a semiconductor film.

In this embodiment mode, an amorphous semiconductor film with a thickness of 40 nm to 300 nm is formed by plasma CVD, and then heat treatment is performed to crystallize the amorphous semiconductor film, thereby forming the crystalline semiconductor films 705 and 706. As the heat treatment, a laser heating furnace, laser irradiation, or irradiation of light emitted from a lamp instead of laser beam (hereinafter referred to as "lamp annealing"), or a combination thereof can be used.

When adopting laser irradiation, a continuous wave laser beam (a CW laser beam) or a pulsed laser beam (a pulse laser beam) can be used. As a usable laser beam, a beam emitted from one or plural kinds of the followings can be used: a gas laser such as an Ar laser, a Kr laser, or an excimer laser; a laser using, as a medium, single crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser. Irradiation with a laser beam having a fundamental wave of such a laser or a second to a fourth harmonic thereof can provide crystals with a large grain size. For instance, the second harmonic (532 nm) or the third harmonic (355 nm) of an Nd:YVO$_4$ laser (fundamental wave is 1064 nm) can be used. In that case, the power density of approximately 0.01 MW/cm$^2$ to 100 MW/cm$^2$ (preferably 0.1 MW/cm$^2$ to 10 MW/cm$^2$) is required for the laser. Then, the irradiation is performed at a scanning rate of approximately 10 cm/sec to 2000 cm/sec.

Each laser using, as a medium, single crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser; and a Ti:sapphire laser, can continuously oscillate. Further, pulse oscillation thereof can be performed with a repetition rate of 10 MHz or more by carrying out Q switch operation or mode synchronization. When a laser beam is oscillated with a repetition rate of 10 MHz or more, a semiconductor film is irradiated with a next pulse during a period where the semiconductor film is melted by the laser beam and then is solidified. Therefore, unlike the case where a pulse laser with a low repetition rate is used, a solid-liquid interface can be continuously moved in the semiconductor film so that crystal grains, which continuously grow in the scanning direction, can be obtained.

When the amorphous semiconductor film is crystallized by using the above-described continuous wave laser or laser beam which oscillates at a frequency of 10 MHz or more, a surface of the crystallized semiconductor film can be planarized. As a result, a gate insulating film which is to be formed later can be formed thinly, and besides, pressure resistance of the gate insulating film can be improved.

In addition, if ceramic (a polycrystal) is used as a medium, the medium can be formed to have a free shape for a short time at low cost. In the case of using a single crystal, a columnar medium with several mm in diameter and several tens of mm in length is usually used. In the case of using ceramic, a medium bigger than the case of using the single crystal can be formed.

Concentration of a dopant such as Nd or Yb in a medium, which directly contributes to light emission, cannot be changed largely in both cases of the single crystal and the polycrystal, and therefore, there is a limitation to some extent in improvement in output of a laser by increasing the concentration of the dopant. However, in the case of ceramic, the size of a medium can be significantly increased as compared with the case of the single crystal, thus drastic improvement in output of a laser can be expected.

Further, in the case of ceramic, a medium with a parallelepiped shape or a rectangular parallelepiped shape can be easily formed. With a medium having such a shape, when oscillated light is made travel in a zig-zag manner inside the medium, a path of the oscillated light can be made long. Therefore, amplitude is increased and a laser beam can be oscillated at high output. Furthermore, a cross section of a laser beam emitted from the medium having such a shape has a quadrangular shape, and therefore, as compared with a laser beam with a circular shape, the laser beam with the quadrangular shape in cross section has an advantage to be shaped into a linear beam. By shaping a laser beam emitted in this manner using an optical system, a linear beam with 1 mm or less in length of a short side and several mm to several m in length of a long side can be easily obtained. In addition, if the medium is uniformly irradiated with excited light, the linear beam has a uniform energy distribution in a long side direction.

If a semiconductor film is irradiated with this linear beam, the semiconductor film can be more uniformly annealed. If uniform annealing is required from one end to the other end of the linear beam, the arrangement in which slits are arranged in both ends of the linear beam so as to shield an attenuated portion of energy of the linear beam, or the like may be performed.

If a semiconductor film is annealed using the thus obtained linear beam with uniform intensity and a semiconductor device is manufactured using this semiconductor film, a characteristic of the semiconductor device can be made favorable and uniform.

Figure 6A:
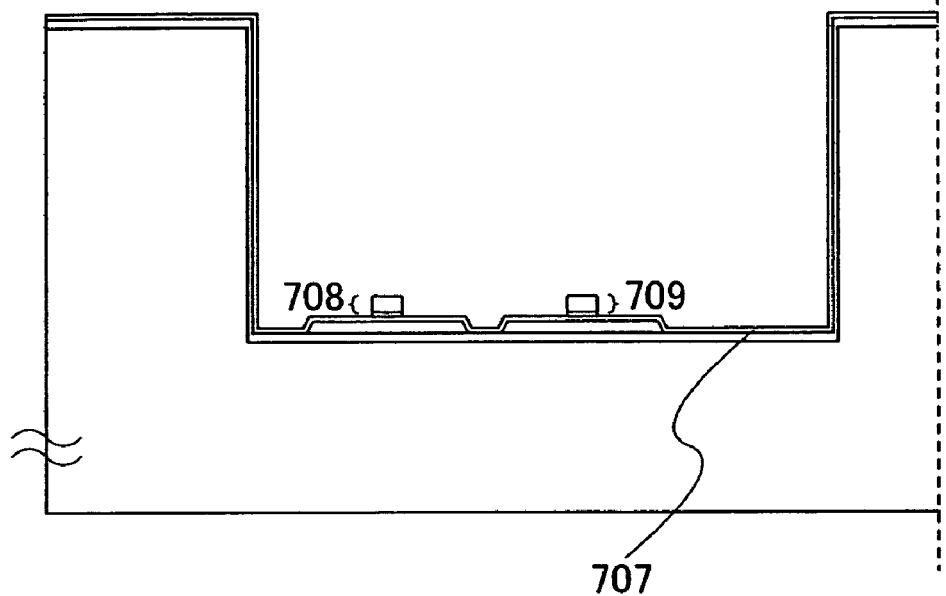
FIGS. 6A and 6B show a manufacturing method of a semiconductor device of the invention (Embodiment Mode 2).

Next, an insulating film 707 which covers the crystalline semiconductor films 705 and 706 is formed (FIG. 6A). The insulating film 707 which is etched in a later step to function as a gate insulating film may be formed by sputtering or any type of CVD such as plasma CVD. Specifically, a silicon oxide film, a silicon nitride film, a silicon oxide film containing nitrogen (a SiO$_x$N$_y$ film)(x>y, x and y are positive integers), or a silicon nitride film containing oxygen (a SiN$_x$O$_y$ film)(x>y, x and y are positive integers) is formed with a single-layer structure or is arbitrarily stacked.

Alternatively, high-density plasma treatment may be performed to the crystalline semiconductor films 705 and 706 in an atmosphere containing oxygen, nitrogen, or oxygen and nitrogen, to oxidize or nitride respective surfaces of the crystalline semiconductor films 705 and 706, thereby forming an insulating film. The gate insulating film formed by the high-density plasma treatment has superior uniformity in film thickness or film quality as compared with the film formed by CVD, sputtering, or the like. In addition, a dense film can be formed as the gate insulating film by the high-density plasma treatment. Although the electron density of plasma is high, the electron temperature around the object to be processed (the metal film), which is formed over the substrate is low; thus plasma damage to the substrate can be prevented. In addition, since the electron density of plasma is as high as $1 \times 10^{11}$ cm$^{-3}$ or more, a film which is superior in uniformness of thickness and is dense can be formed by using an oxide formed by oxidation treatment using the high-density plasma treatment. Further, since the electron temperature of plasma is as low as 1.5 eV or less, oxidation treatment can be performed at a lower temperature as compared with plasma treatment or thermal oxidation. For example, even when plasma treatment is performed at a temperature lower than a strain point of the glass substrate by approximately 100° C. or more (typically at 250° C. to 550° C.), plasma oxidation treatment can be sufficiently performed. Note that, as a power source frequency for generating plasma, a microwave (2.45 GHz) is used. In addition, potential of plasma is as low as 5 V or less so that excessive dissociation of material molecules can be suppressed.

As the atmosphere containing oxygen, a mixed gas of oxygen (O$_2$), nitrogen dioxide (NO$_2$) or dinitrogen monoxide (N$_2$O), and a rare gas; or a mixed gas of oxygen (O$_2$), nitrogen dioxide (NO$_2$) or dinitrogen monoxide (N$_2$O), a rare gas, and hydrogen (H$_2$) can be used. Further, as the atmosphere containing nitrogen, a mixed gas of nitrogen (N$_2$) or ammonia (NH$_3$) and a rare gas; or a mixed gas of nitrogen (N$_2$) or ammonia (NH$_3$), a rare gas, and hydrogen (H$_2$) can be used. Each surface of the crystalline semiconductor films 705 and 706 can be oxidized or nitrided by oxygen radicals (which may contain OH radicals) or nitrogen radicals (which may contain NH radicals) generated by the high-density plasma.

In the case where the insulating film 707 is formed by high-density plasma treatment, an insulating film with a thickness of 1 nm to 20 nm, typically 5 nm to 10 nm, is formed on the crystalline semiconductor films 705 and 706. A reaction in that case is a solid-phase reaction, and therefore, interface state density between the insulating film and the crystalline semiconductor films 705 and 706 can be extremely reduced. Further, since the crystalline semiconductor films 705 and 706 are directly oxidized or nitrided, variations in thickness of the insulating film 707 to be formed can, ideally, be suppressed significantly. Furthermore, since strong oxidation is not generated in a crystal grain boundary of crystalline silicon, an extremely preferable state is made. That is, if each surface of the semiconductor films is subjected to solid-phase oxidation by the high-density plasma treatment described here, an insulating film with low interface state density and good uniformity can be formed without generating excessive oxidation reaction in a crystal grain boundary.

Note that, as the insulating film 707, only an insulating film formed through the high-density plasma treatment may be used; alternatively, another insulating film of silicon oxide, silicon nitride containing oxygen, silicon oxide containing nitrogen, or the like may be stacked on the insulating film formed through the high-density plasma treatment by CVD utilizing plasma or a thermal reaction. In either case, when a transistor is formed with a gate insulating film which partly or entirely includes the insulating film formed by high-density plasma, variations in characteristics thereof can be reduced.

Further, the crystalline semiconductor films 705 and 706 formed by crystallizing the amorphous semiconductor film by irradiation of a continuous wave laser beam or a laser beam oscillated at a frequency of 10 MHz or more while scanning the amorphous semiconductor film with the laser beam in one direction, have a characteristic that crystals grow in a scanning direction of the laser beam. Therefore, when a transistor is disposed such that the scanning direction corresponds to a channel length direction (a direction of flowing carries when a channel formation region is formed) and the insulating film 707 formed by the high-density plasma treatment is combined with the transistor, a transistor with less variations in characteristics and high electron field-effect mobility can be obtained.

Next, a first conductive film and a second conductive film are stacked over the insulating film 707. The first conductive film and the second conductive film may be formed by sputtering or any type of CVD such as plasma CVD. In this embodiment mode, the first conductive film is formed to have a thickness of 20 nm to 100 nm, whereas the second conductive film is formed to have a thickness of 100 nm to 400 nm. The first conductive film and the second conductive film can be formed of an element selected from tantalum (Ta), tungsten (W), titanium (Ti), molybdenum (Mo), aluminum (Al), copper (Cu), chromium (Cr), niobium (Nb), and the like; or an alloy material or a compound material containing the element as a main constituent. Further, the first and second conductive films can also be formed of a semiconductor material typified by polycrystalline silicon doped with an impurity element such as phosphorus. As a combination of the first conductive film and the second conductive film, a tantalum nitride film and a tungsten (W) film; a tungsten nitride film and a tungsten film; a molybdenum nitride film and a molybdenum (Mo) film; or the like can be given. Since tungsten and tantalum nitride have high heat resistance, after forming the first and second conductive films, heat treatment for thermal activation can be carried out. Further, either a single-layer structure or a three-layer structure may be employed instead of the two-layer structure of the first and second conductive films. In the case of either a single-layer structure or a three-layer structure, a material of the conductive film can be freely selected from the above-described ones of the first conductive film and the second conductive film.

Next, a mask is formed using a resist by photolithography, and then etching of the first conductive film and the second conductive film is performed, thereby forming gate electrodes 708 and 709.

Figure 6B:
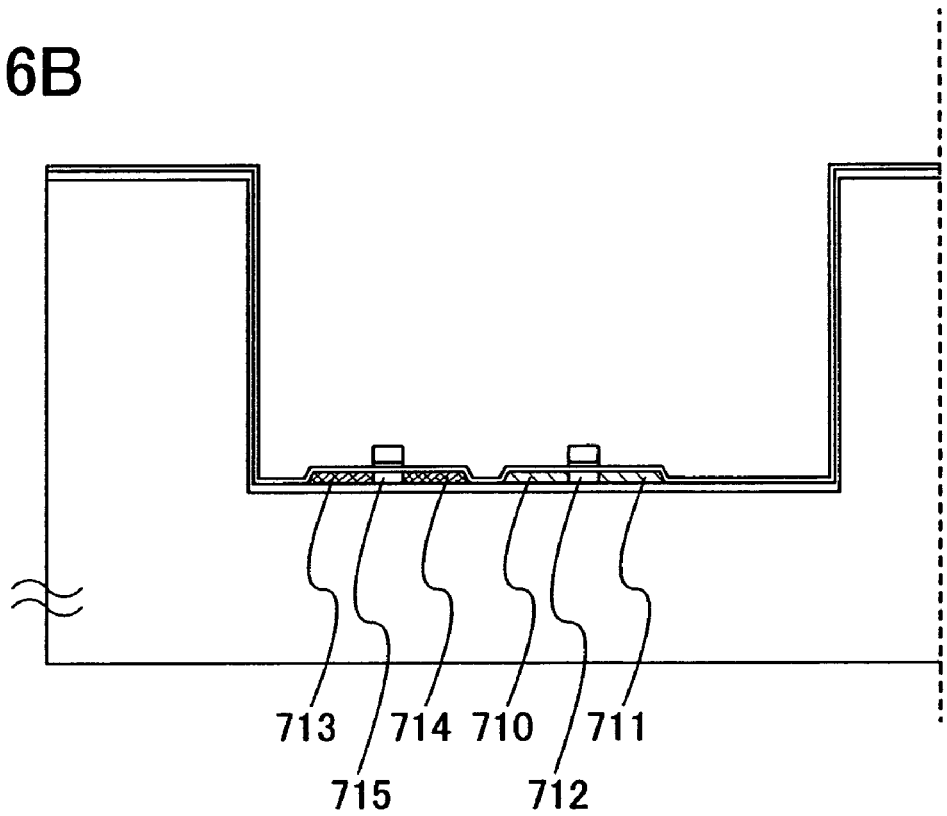

Next, a mask is formed using a resist by photolithography, and then an impurity element imparting N-type conductivity is added at a low concentration to the crystalline semiconductor film 706 by ion doping or ion implantation, thereby forming N-type low-concentration impurity regions 710 and 711 and a channel formation region 712 (FIG. 6B). As the impurity element imparting the N-type conductivity, an element belonging to Group 15 of the periodic table may be used, and for example, phosphorus (P) or arsenic (As) is used.

Next, a mask is formed using a resist by photolithography, and then an impurity element imparting P-type conductivity is added at a high concentration to the crystalline semiconductor film 705 by ion doping or ion implantation, thereby forming P-type high-concentration impurity regions 713 and 714 and a channel formation region 715. As the impurity element imparting the P-type conductivity, an element belonging to Group 13 of the periodic table may be used, and for example, boron (B) is used. As for the order of forming the N-type low-concentration impurity regions 710 and 711 and the P-type high-concentration impurity regions 713 and 714, the P-type high-concentration impurity regions 713 and 714 may be formed after the N-type low-concentration impurity regions 710 and 711 are formed as described in this embodiment mode; or the N-type low-concentration impurity regions 710 and 711 may be formed after the P-type high-concentration impurity regions 713 and 714 are formed.

Figure 7A:
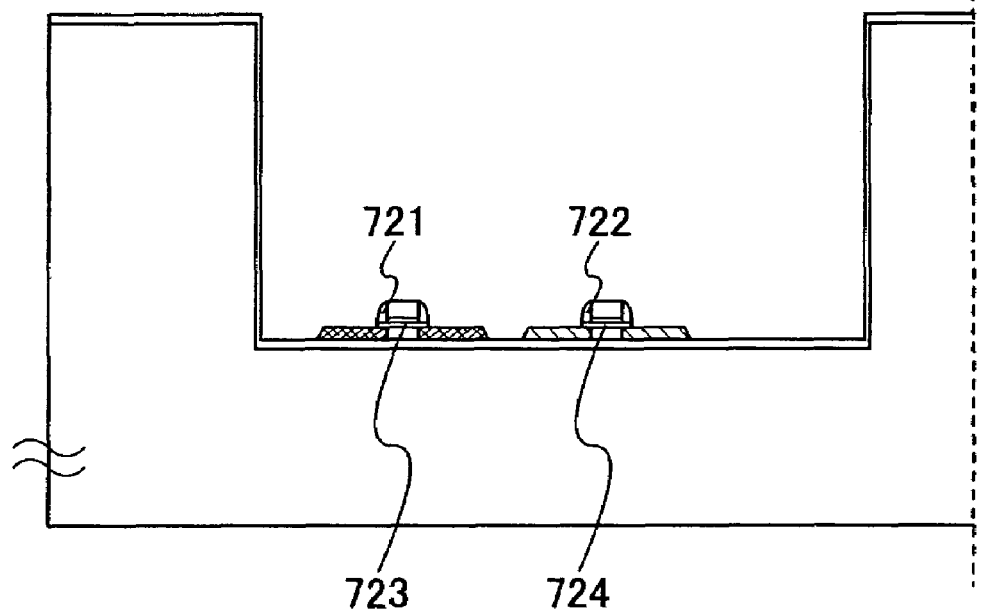
FIGS. 7A and 7B show a manufacturing method of a semiconductor device of the invention (Embodiment Mode 2).

Next, an insulating film is formed so as to cover the insulating film 707 and the gate electrodes 708 and 709. The insulating film is formed by a single layer or a multi-layer of a film formed of an inorganic material such as silicon, oxide of silicon, and nitride of silicon, or a film formed of an organic material such as an organic resin by sputtering or any type of CVD such as plasma CVD. Next, the insulating film is selectively etched by anisotropic etching which is mainly in the vertical direction, thereby forming insulating films (also referred to as "sidewalls") 721 and 722 in contact with side surfaces of the gate electrodes 708 and 709 (FIG. 7A). At the same time as the formation of the insulating films 721 and 722, the insulating film 707 is etched so that gate insulating films 723 and 724 are formed. The insulating films 721 and 722 are later used as masks for doping to form an LDD (Lightly Doped Drain) region of an N-type thin film transistor.

Figure 7B:
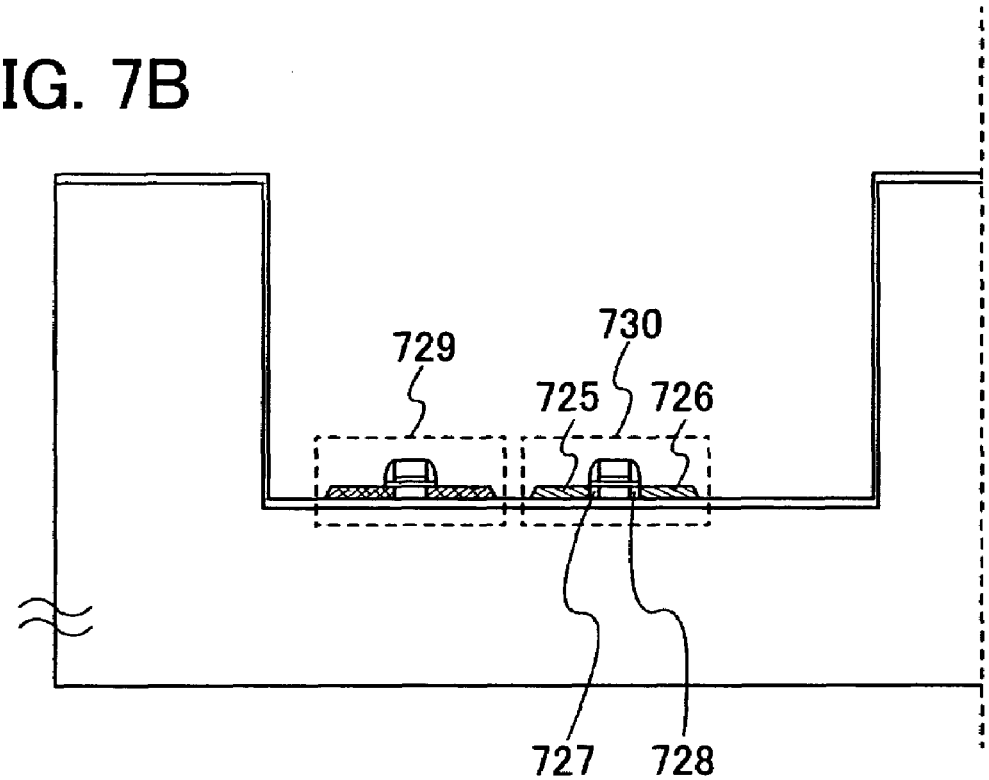

Next, a resist mask is formed by photolithography. Using the resist mask and the insulating films 721 and 722 as masks, an impurity element imparting N-type conductivity is added into the crystalline semiconductor film 706 so that first N-type impurity regions (also called "LDD regions") 727 and 728 and second N-type impurity regions 725 and 726 are formed (FIG. 7B). The concentration of the impurity element in the first N-type impurity regions 727 and 728 is lower than that in the second N-type impurity regions 725 and 726. Through the above-described steps, a P-type thin film transistor 729 and an N-type thin film transistor 730 are completed.

There are the following two methods for forming the LDD region: in one method, a gate electrode is formed with a multi-layer structure having two or more layers, and taper etching or anisotropic etching is performed to the gate electrode and a conductive film of the lower layer included in the gate electrode is used as a mask; in the other method, an insulating film which is a sidewall is used as a mask as is in this embodiment mode. A thin film transistor that is formed by the former method has the structure in which an LDD region is overlapped with a gate electrode with a gate insulating film interposed therebetween; however, this structure which utilizes taper etching or anisotropic etching of the gate electrode is difficult to control the width of the LDD region, and the LDD region is not necessarily be formed if the etching step is not performed preferably. On the other hand, the latter method which uses a sidewall insulating film as a mask is, as compared to the former method, easy to control the width of the LDD region, thereby the LDD region can be formed certainly.

After removing a natural oxide film, which is formed on exposed surfaces of the N-type impurity regions 725 and 726 and the P-type impurity regions 713 and 714, a silicide region may be arbitrarily formed by using a metal film. As the metal film, a film made from nickel, titanium, cobalt, or platinum; a film made from an alloy containing at least two kinds of these elements; or the like can be used. Specifically, a nickel film is used as the metal film, for example, and the nickel film is formed by sputtering at power of 500 W to 1 kW under room temperature, and then a silicide region is formed by heat treatment. The heat treatment can employ RTA, an annealing furnace, or the like. At this time, by controlling the thickness of the metal film, the heating temperature, and the heating time, a silicide region may be formed only on surfaces of the N-type impurity regions 725 and 726 and the P-type impurity regions 713 and 714, or alternatively, a silicide region can be formed on an entire region of each region. Then, nickel which is unreacted is removed. For example, the unreacted nickel is removed by using an etching solution of $HCl:HNO_3:H_2O=3:2:1$.

Note that this embodiment mode describes the example in which the thin film transistors 729 and 730 are of a top-gate type; however, each of the thin film transistors may be, of course, a bottom-gate thin film transistor. Further, a single gate structure in which one channel formation region is formed in each of the thin film transistors 729 and 730, is described in this embodiment mode; however, a double gate structure in which two channel formation regions are formed in each of the thin film transistors or a triple gate structure in which three channel formation regions are formed in each of the thin film transistors may be employed. Moreover, a dual gate structure having two gate electrodes which are disposed over and under a channel formation region with a gate insulating film interposed therebetween, or another structure may be employed.

In this embodiment mode, both of the N-type thin film transistor and the P-type thin film transistor are formed as the thin film transistors 729 and 730; however, only one of either the N-type thin film transistor or the P-type thin film transistor may be formed.

In addition, after completing the P-type thin film transistor 729 and the N-type thin film transistor 730 through the above-described steps, heat treatment for recovering crystallinity of the semiconductor films or activating the impurity elements added into the semiconductor films, may be performed. Further, after performing the heat treatment, the exposed insulating film 707 may be preferably subjected to high-density plasma treatment in an atmosphere containing hydrogen so that a surface of the insulating film 707 contains hydrogen. This is because the hydrogen can be utilized when performing a step of hydrogenating the semiconductor film later. Alternatively, by performing high-density plasma treatment in an atmosphere containing hydrogen while heating the substrate at 350° C. to 450° C., hydrogenation of the semiconductor film can also be performed. As the atmosphere containing hydrogen, a mixed gas of hydrogen ($H_2$) or ammonia ($NH_3$) and a rare gas (e.g., argon:Ar) can be used. If a mixed gas of ammonia ($NH_3$) and a rare gas (e.g., argon:Ar) is used as the atmosphere containing hydrogen, the surface of the insulating film 707 can be hydrogenated and nitrided at the same time.

Figure 8A:
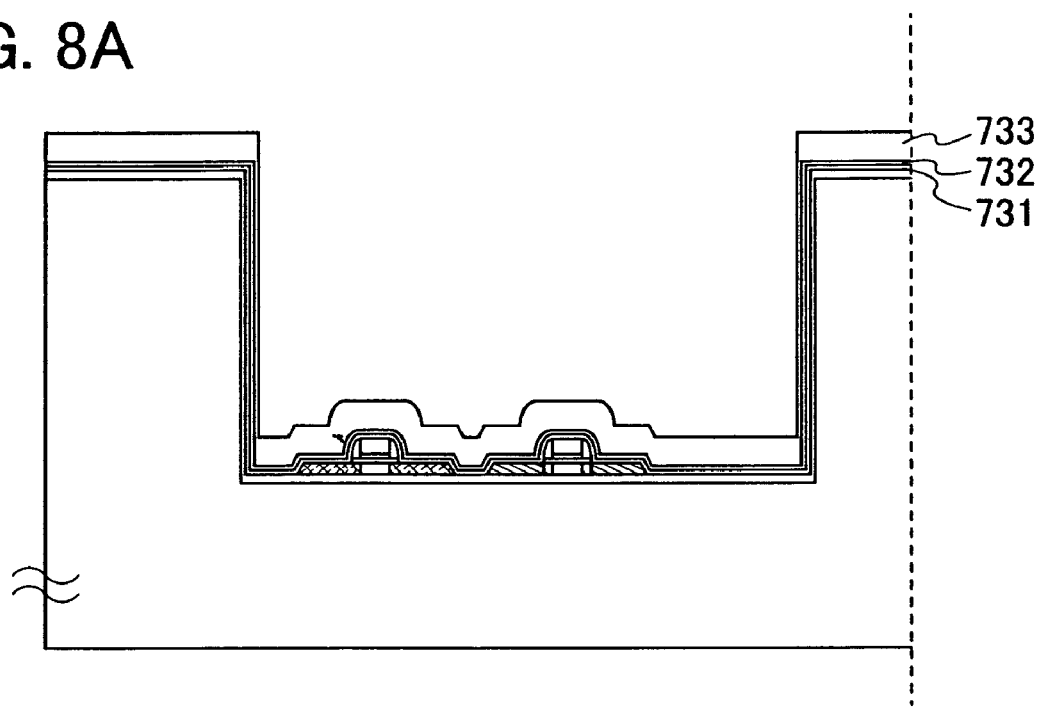
FIGS. 8A and 8B show a manufacturing method of a semiconductor device of the invention (Embodiment Mode 2).

Next, a single layer or a multi-layer of an insulating film is formed to cover the thin film transistors 729 and 730 (FIG. 8A). The insulating film covering the thin film transistors 729 and 730 is formed with a single layer or a multi-layer made from an inorganic material such as oxide of silicon or nitride of silicon, an organic material such as polyimide, polyamide, benzocyclobutene, acrylic, epoxy, or siloxane, or the like, by SOG, a droplet discharging method, or the like. In this specification, "siloxane" has a skeleton structure including silicon (Si)-oxygen (O) bonds and an organic group containing at least hydrogen (e.g., an alkyl group or aromatic hydrocarbon) is used as a substituent. Further, as the substituent, a fluoro group may be used, or both of an organic group containing at least hydrogen and a fluoro group may be used as the substituents. In this embodiment mode, the insulating film covering the thin film transistors 729 and 730 has a three-layer structure; a silicon oxide film containing nitrogen is formed as a first insulating film 731, a silicon nitride film is formed as a second insulating film 732, and a silicon oxide film containing nitrogen is formed as a third insulating film 733.

In the case where the insulating film covering the thin film transistors 729 and 730 has a single-layer structure, a silicon nitride film or a silicon nitride film containing oxygen may be formed. At this time, the silicon nitride film or the silicon nitride film containing oxygen may be preferably subjected to high-density plasma treatment in an atmosphere containing hydrogen so that a surface of the silicon nitride film or the silicon nitride film containing oxygen contains hydrogen. This is because the hydrogen can be utilized when performing a step of hydrogenating the semiconductor film later. Alternatively, by performing high-density plasma treatment in an atmosphere containing hydrogen while heating the substrate at 350° C. to 450° C., hydrogenation of the semiconductor film can also be performed. As the atmosphere containing hydrogen, a mixed gas of hydrogen ($H_2$) or ammonia ($NH_3$) and a rare gas (e.g., argon:Ar) can be used. If a mixed gas of ammonia ($NH_3$) and a rare gas (e.g., argon:Ar) is used as the atmosphere containing hydrogen, the surface of the insulating film 707 can be hydrogenated and nitrided at the same time.

Note that, prior to forming the insulating films 731 to 733, or after forming one or a plurality of thin films of the insulating films 731 to 733, heat treatment for recovering crystallinity of the semiconductor films, activating the impurity elements added into the semiconductor films, or hydrogenating the semiconductor films, may be performed. The heat treatment may use thermal annealing, laser annealing, RTA, or the like. For example, in order to activate the impurity elements, thermal annealing at 500° C. or more may be performed. In order to hydrogenate the semiconductor films, thermal annealing at 350° C. to 450° C. may be performed.

Figure 8B:
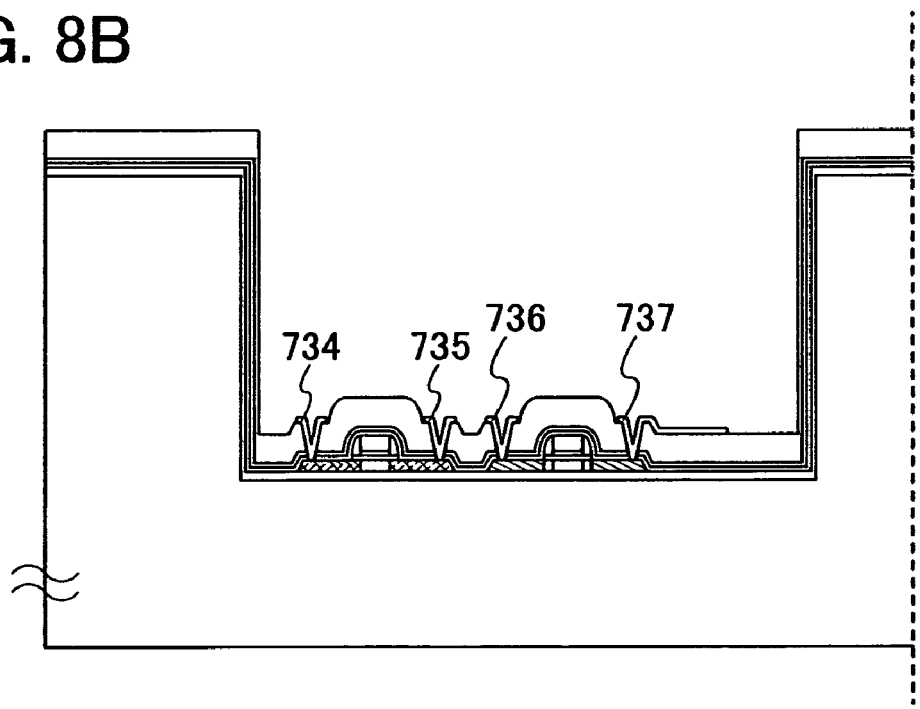

Next, the insulating films 731 to 733 are etched by photolithography, and contact holes are formed to expose the N-type impurity regions 725 and 726 and the P-type impurity regions 713 and 714. Subsequently, a conductive film is formed to fill the contact holes. The conductive film is etched into a desired shape to form conductive films 734 to 737 each functioning as a source wiring or a drain wiring (FIG. 8B).

The conductive films 734 to 737 are formed using a conductive film containing aluminum (Al) as a main constituent by sputtering or any type of CVD such as plasma CVD. The conductive film containing aluminum (Al) as a main constituent corresponds to, for example, a material containing aluminum as a main constituent and also containing nickel, or an alloy material containing aluminum as a main constituent and also containing nickel and one or both of carbon and silicon. Since the conductive film containing aluminum as a main constituent generally has a drawback of a poor heat resistance, the conductive film containing aluminum as a main constituent is preferably sandwiched between barrier films. The barrier films refer to films having a function of suppressing hillock of the conductive film containing aluminum as a main constituent or of improving heat resistance. As a material having such a function, chromium, tantalum, tungsten, molybdenum, titanium, silicon, or nickel, or nitride thereof can be used.

An example of a structure of each of the conductive films 734 to 737 is the structure in which a titanium film, an aluminum film, and a titanium film are sequentially stacked from a substrate side. Since titanium is an element having a high reducing property, even when a thin natural oxide film is formed on the crystalline semiconductor film, the titanium film reduces the natural oxide film so that good contact to the crystalline semiconductor film can be made. Further, the titanium film formed between the crystalline semiconductor film and the aluminum film is preferably subjected to high-density plasma treatment in an atmosphere containing nitrogen to nitride a surface of the titanium film. As the atmosphere containing nitrogen, a mixed gas of $N_2$ or $NH_3$ and a rare gas, or a mixed gas of $N_2$ or $NH_3$, a rare gas, and $H_2$ can be used. Nitriding the surface of the titanium film prevents alloying of titanium and aluminum in a later step of heat treatment or the like and prevent aluminum from dispersing in the crystalline semiconductor film through the titanium film. Although the example in which the aluminum film is sandwiched using the titanium film is described here, the same can be applied to the case of using a chromium film, a tungsten film, or the like instead of the titanium film. More preferably, formation of one titanium film, nitriding treatment of the surface of the titanium film, formation of the aluminum film, and formation of the other titanium film may be successively carried out by using a multi-chamber apparatus without exposing to atmospheric air.

Next, an insulating film 738 is formed to cover the conductive films 734 to 737 with a thickness of 0.75 μm to 3 μm. The insulating film 738 is formed of a single layer or a multi-layer by using an inorganic material or an organic material by CVD, SOG, a droplet discharging method, or the like. Specifically, although those described as the materials of the insulating films 731 to 733 can be used, an oxazole resin (a kind of organic material) typified by photosensitive polybenzoxazole may be preferably used. Photosensitive polybenzoxazole is a material having characteristics of a low dielectric constant (a dielectric constant of 2.9 at room temperature and 1 MHz), high heat resistance (a thermal decomposition temperature of 550° C. with the rise in temperature at 5° C./min in TGA (:Thermal Gravity Analysis)), a low moisture absorbing rate (0.3% in 24 hours at room temperature), or the like. For example, photosensitive polybenzoxazole which is lower in the dielectric constant as compared to polyimide is suitable to use as an interlayer insulating film.

Figure 9A:
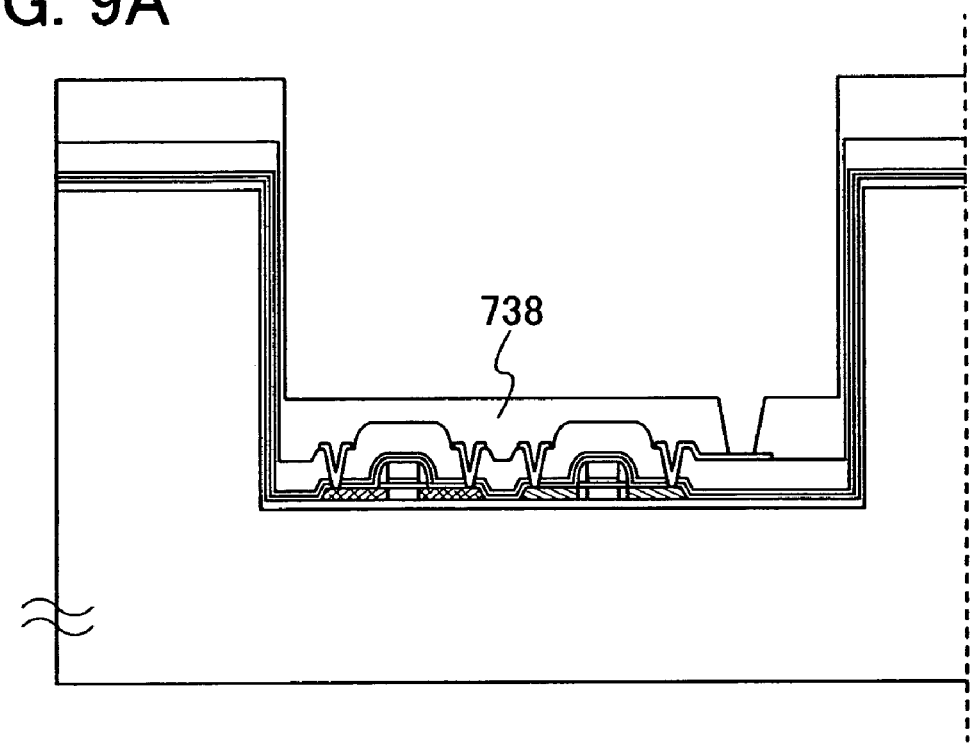
FIGS. 9A and 9B show a manufacturing method of a semiconductor device of the invention (Embodiment Mode 2).
Figure 9B:
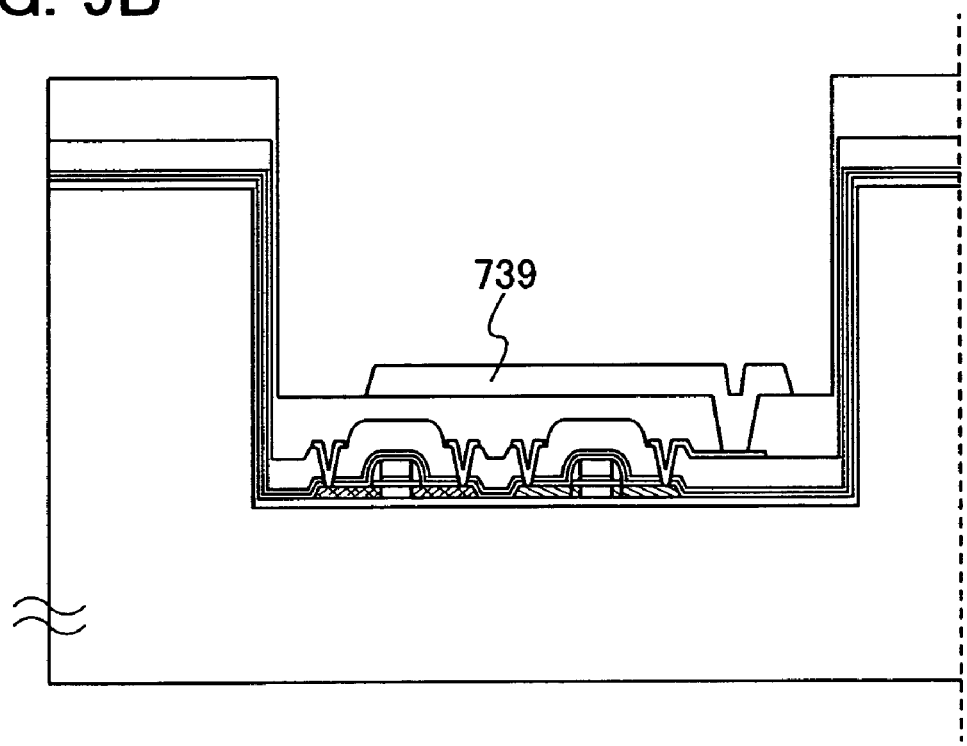

Next, the insulating film 738 is etched by photolithography to form a contact hole through which the conductive film 737 is exposed (FIG. 9A). Subsequently, a conductive film 739 which functions as an antenna is formed on a top surface of the insulating film 738 so as to fill the contact hole (FIG. 9B). The conductive film 739 is not limited to a single-layer structure and may have a multi-layer structure.

Here, the shape of the conductive film 739 which functions as an antenna is described. A signal transmission method in a semiconductor device (a wireless chip) provided with an antenna, capable of exchanging data without contact, can be selected arbitrarily considering its intended purpose, and in accordance with the transmission method, the antenna with an appropriate shape can be arbitrarily provided. Note that as the signal transmission method, an electromagnetic coupling method, an electromagnetic induction method, a microwave method, or the like can be used.

For example, in the case of employing an electromagnetic coupling method or an electromagnetic induction method (e.g., a 13.56 MHz band) as the signal transmission method in the semiconductor device, electromagnetic induction caused by change in magnetic field density is used, and therefore, the conductive film functioning as an antenna is formed in an annular shape (e.g., a loop antenna) or a spiral shape.

In the case of employing a microwave method (e.g., a UHF band: an 860 to 960 MHz band, a 2.45 GHz band, or the like) as the signal transmission method in the semiconductor device, the shape such as length of the conductive layer functioning as an antenna can be set arbitrarily considering the wavelength of an electromagnetic wave used for signal transmission. For example, the conductive film 739 can be formed in a linear shape (e.g., a dipole antenna) or a flat shape (e.g., a patch antenna). Further, the shape of the conductive film 739 is not limited to a straight-line shape; the shape may be a curved-line shape, a meander shape, or a combination thereof, considering the wavelength of the electromagnetic wave.

Described next is a forming method and a material of the conductive film 739 functioning as an antenna. As the forming method of the conductive film 739, CVD, sputtering, printing such as screen printing or gravure printing, a droplet discharging method, a dispenser method, plating, or the like can be employed. As the material of the conductive film 739, an element selected from aluminum (Al), titanium (Ti), silver (Ag), copper (Cu), gold (Au), platinum (Pt), nickel (Ni), palladium (Pd), tantalum (Ta), and molybdenum (Mo); or an alloy material or a compound material containing the element as a main constituent can be used. Alternatively, fine particles containing solder (preferably, lead-free solder) as a main constituent may be used; in that case, it is preferable to use fine particles having a grain size of 20 μm or less. Solder has an advantage of low cost. Further alternatively, ceramic, ferrite, or the like can be adopted as the antenna.

For example, in the case of forming the conductive film 739 by screen printing, the conductive film 739 can be provided by selectively printing conductive paste in which conductive particles having a grain size of several nm to several tens of μm are dissolved or dispersed in an organic resin. As the conductive particle, a fine particle or a dispersive nanoparticle of metal of one or more of silver (Ag), gold (Au), copper (Cu), nickel (Ni), platinum (Pt), palladium (Pd), tantalum (Ta), molybdenum (Mo), and titanium (Ti) or silver halide can be used. In addition, as the organic resin included in the conductive paste, one or a plurality of organic resins for functioning as a binder, a solvent, a dispersant, or a coating of the metal particle can be used; typically, an organic resin such as an epoxy resin or a silicon resin can be used. When forming the conductive film 739, baking may be preferably performed after the conductive paste is applied. For example, in the case of using fine particles (of which grain size is in the range of 1 nm to 100 nm inclusive) containing silver as its main constituent as the material of the conductive paste, the conductive film 739 can be obtained by curing through baking at 150° C. to 300° C.

In the case of applying an electromagnetic coupling method or an electromagnetic induction method, and providing a semiconductor device (an RFID) including an antenna in contact with metal, a magnetic material having magnetic permeability is preferably provided between the semiconductor device and the metal. In the case where a semiconductor device including an antenna is provided in contact with metal, an eddy current flows in the metal accompanying change in magnetic field, and the change in magnetic field is impaired by the eddy current, thereby decreasing the communication distance. Therefore, eddy current of the metal and a decrease in communication distance can be suppressed by providing a material having magnetic permeability between the semiconductor device and the metal. Note that as the magnetic material, ferrite or a metal thin film having high magnetic permeability and little loss of high frequency wave can be used.

Through the above-described steps, an element layer in which an element is disposed within a region where the groove 12 is formed is formed. At this time, as well as the element is disposed within the region where the groove 12 is formed, a part of the substrate 11 exists adjacent to a side surface of the element. This part of the substrate 11 serves to maintain the strength and prevent destruction of the element in grinding and polishing the substrate 11 later. The method described in Embodiment Mode 1 can be applied to the other process for forming a semiconductor device after the element layer is formed, description thereof is thus omitted here.

As described above, in the present invention, a layer to be transposed 853 is formed in the groove 12 which is formed in the substrate 11, the substrate is ground and polished until a bottom surface of the groove 12 (i.e., a bottom surface of the base film 13) is exposed, and the layer to be transposed 853 is transposed to form a semiconductor device. By using the invention as above, a semiconductor device which is thinner than a conventional one can be provided.

It is to be noted that this embodiment mode can be implemented combining freely with the above-described embodiment mode. That is, the materials and the forming methods described in the above-described embodiment mode can also be used in this embodiment mode, whereas the materials and the forming methods described in this embodiment mode can also be used in the above-described embodiment mode.

Embodiment Mode 3

This embodiment mode will describe a manufacturing method of a semiconductor device which is different from that described in Embodiment Mode 2, with reference to the drawings.

The structure in which the antenna (conductive film 739) is formed as a part of the element layer is described in Embodiment Mode 2. In this embodiment mode, the structure in which a base member provided with an antenna, which is separately prepared, and a layer to be transposed which is formed over a laminated film are attached will be described.

Figure 10A:
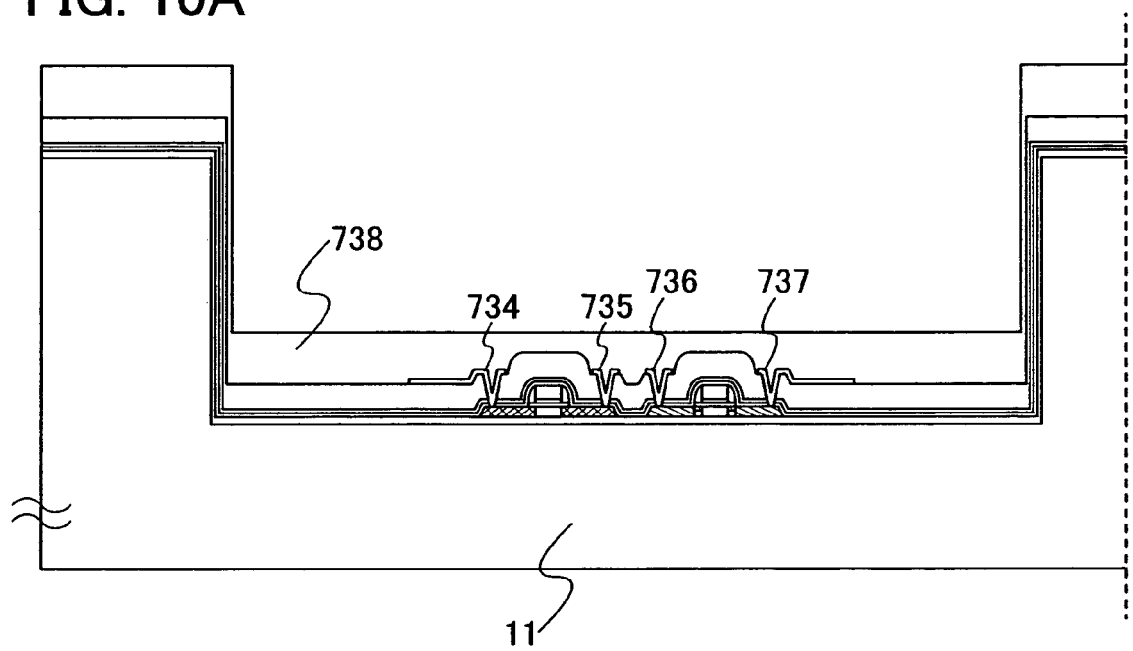
FIGS. 10A and 10B show a manufacturing method of a semiconductor device of the invention (Embodiment Mode 3).

First, through the steps described in Embodiment Mode 2, the insulating film 738 is formed to cover the conductive films 734 to 737 (FIG. 10A). The conductive film 734 shown in FIG. 10A is denoted by the same reference numeral as the conductive film 734 described in Embodiment Mode 2 (FIG. 8B) since the materials thereof can be the same, through the shapes thereof are different.

Figure 10B:
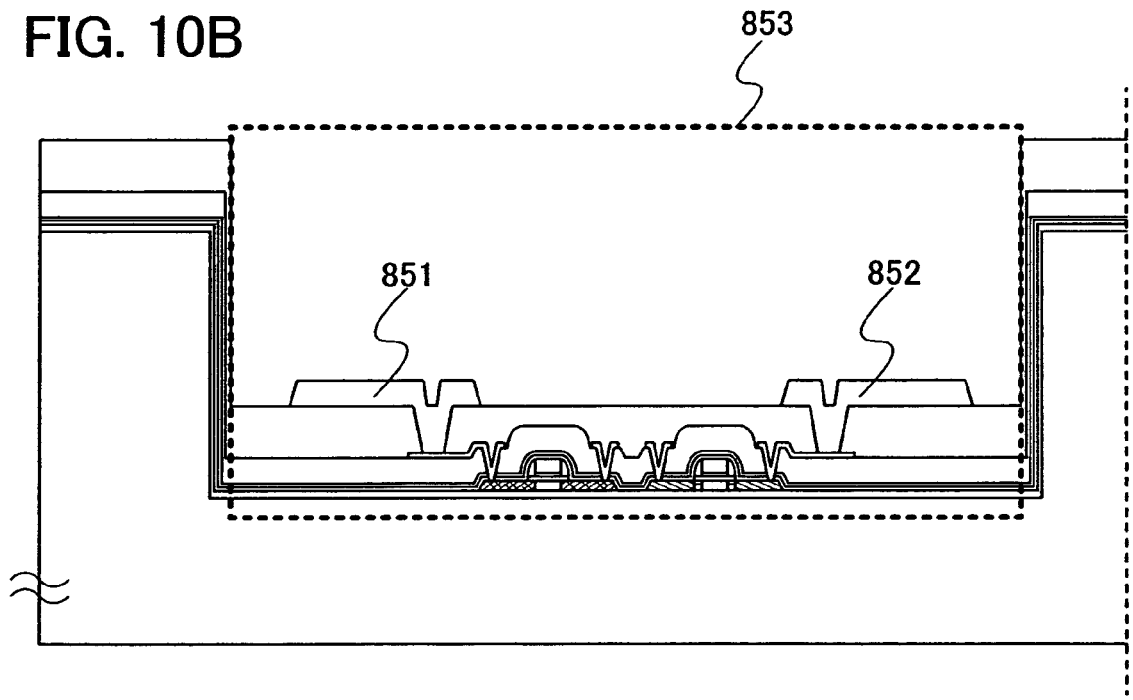

Next, contact holes are formed so as to expose the conductive films 734 and 737, and then conductive films 851 and 852 (also called "pads") are formed so as to cover a top surface of the insulating film 738 and the contact holes (FIG. 10B). The conductive films 851 and 852 can be formed using arbitrarily the same material as that of the conductive film 739 described in Embodiment Mode 2. Further, each of the conductive films 851 and 852 is not limited to a single-layer structure, and a multi-layer structure may be employed. Through the above-described steps, an element layer is formed.

Then, in accordance with the steps described in Embodiment Mode 1, the substrate 11 is ground and polished to form the layer to be transposed 853 (corresponding to the layer to be transposed 15 in FIG. 4B) in plural number, and then the first laminated film 61 is attached to one surface of each of the plurality of layers to be transposed 853, thereby the plurality of layers to be transposed 853 are transposed onto the first laminated film 61 (FIG. 4B).

Figure 11:
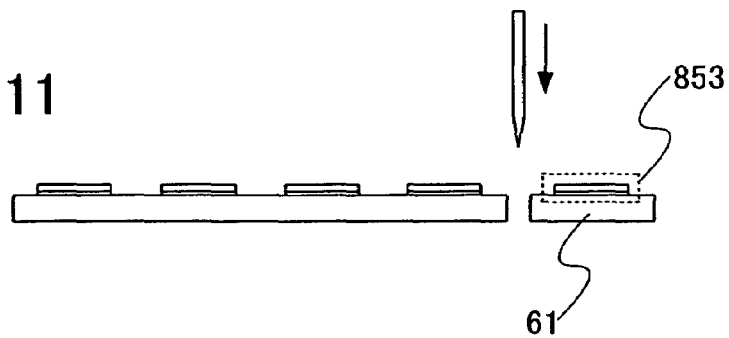
FIG. 11 shows a manufacturing method of a semiconductor device of the invention (Embodiment Mode 3).

Next, the first laminated film 61 is cut so as to separate the plurality of layers to be transposed 853 from one another (FIG. 11). Subsequently, a base member 861 provided with antennas 862 and 863 is attached to the laminated film provided with the one layer to be transposed 853 (FIG. 12).

Figure 12:
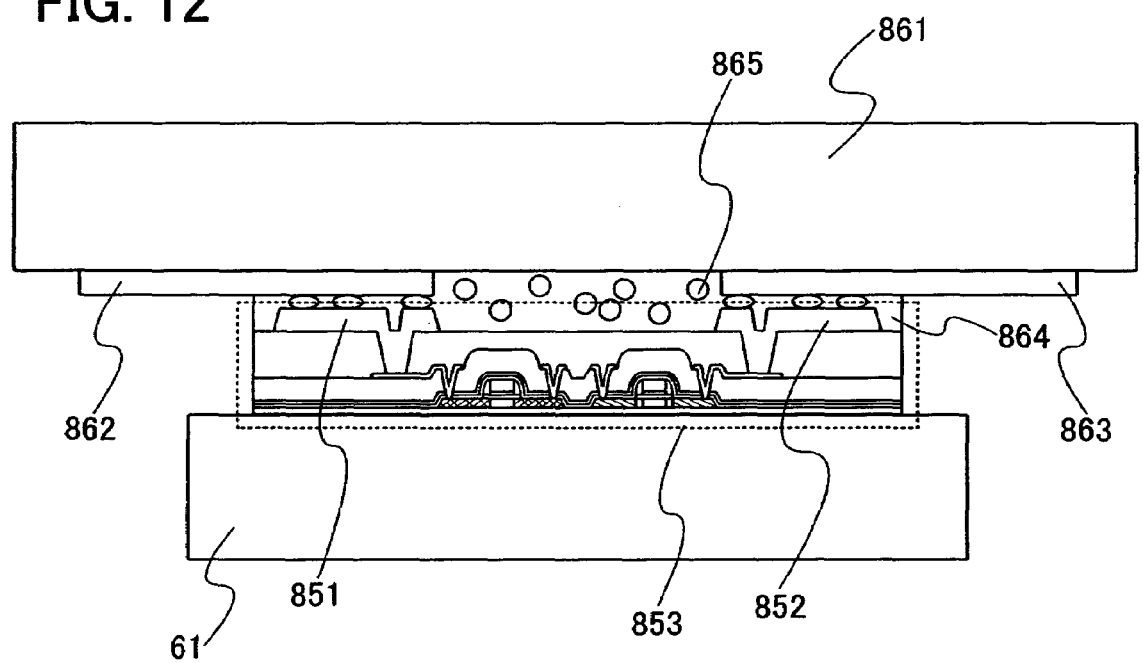
FIG. 12 shows a manufacturing method of a semiconductor device of the invention (Embodiment Mode 3).

In FIG. 12, an anisotropic conductive material is used as the attachment means. The anisotropic conductive material contains conductive particles 865 and a fluid, and the fluid is cured by baking to be an adhesive layer 864. The antennas 862 and 863 can be electrically connected to the conductive films (pads) 851 and 852 due to pressure-bonding of the conductive particles 865. The conductive films 851 and 852 functions as a wiring for electrically connecting between the antennas 862 and 863 and the element (e.g., a thin film transistor) formed inside the layer to be transposed 853. In the other region than the connected portions between the antennas 862 and 863 and the conductive films 851 and 852, since a sufficient distance is kept by the conductive particles 865, electrical connection is not formed. Note that as the attachment means, a method of bonding a metal and a metal by using ultrasonic waves (called "ultrasonic bonding") or a method of attaching by using ultraviolet curable resin or a two-sided tape can also be employed as well as the method using the anisotropic conductive material.

Through the above-described steps, a semiconductor device (a chip) is completed. Although even at the state where the antenna provided over the base member and the layer to be transposed formed over the laminated film are attached to each other, function as a semiconductor device can be obtained, film-sealing may be preferably performed considering long-term reliability of the semiconductor device.

As described above, in the present invention, a layer to be transposed is formed in a groove which is formed in a substrate, and the substrate is ground and polished until a bottom surface of the groove is exposed, so that a semiconductor device which is thinner than a conventional one can be provided.

It is to be noted that this embodiment mode can be implemented combining freely with the above-described embodiment modes. That is, the materials and the forming methods described in the above-described embodiment modes can also be used in this embodiment mode, whereas the materials and the forming methods described in this embodiment mode can also be used in the above-described embodiment modes.

Embodiment Mode 4

In this embodiment, a structure of a semiconductor device, in which a base member provided with an antenna having various shapes is attached to a layer to be transposed formed over a laminated film which is manufactured in accordance with the steps described in Embodiment Mode 3, will be described.

A structure of a semiconductor device using a dipole antenna as one shape of the antenna is described using FIGS.

Figure 13A:
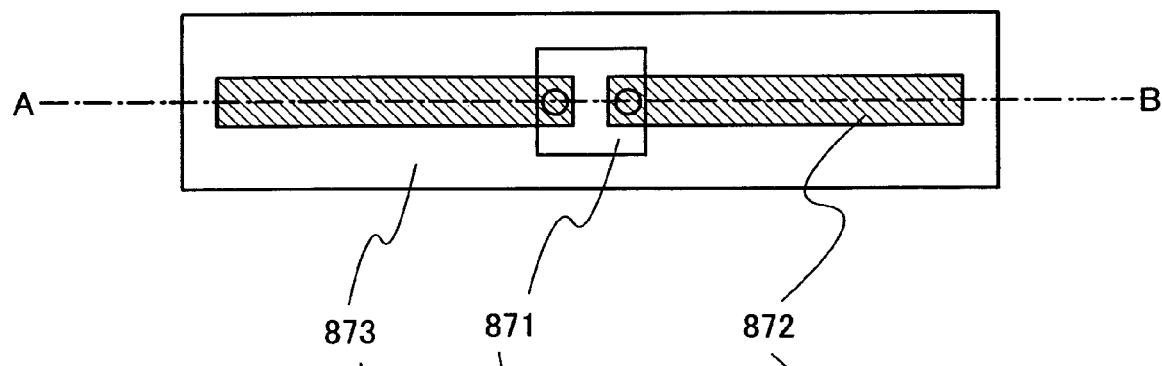
FIGS. 13A and 13B show a semiconductor device of the invention (Embodiment Mode 4).
Figure 13B:
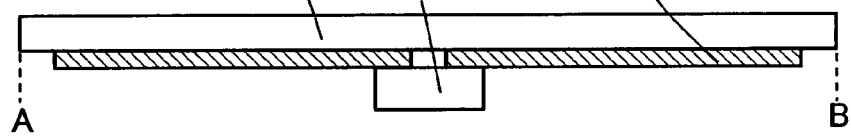

13A and 13B. FIG. 13A is a top view of the semiconductor device, and FIG. 13B is a cross-sectional view along line A-B in FIG. 13A.

An element formed inside a layer to be transposed 871 formed over a laminated film is electrically connected to a dipole antenna 872 provided over a base member 873. The method for electrically connecting the element formed inside the layer to be transposed 871 and the dipole antenna 872 is not limited to the method using an anisotropic conductive material, and a method using conductive adhesive or a TAB (Tape Automated Bonding) method may also be used. Plating treatment may be preferably performed to the dipole antenna 872 in the surface of the other region than the portion of electrically connected to the element formed inside the layer to be transposed 871. By plating the surface of the dipole antenna 872, antenna deterioration can be suppressed.

Further, the layer to be transposed 871 and the base member 873 may be preferably sealed as required with two pieces of laminated films. By sealing, long-term reliability of the semiconductor device can be improved.

Figure 14A:
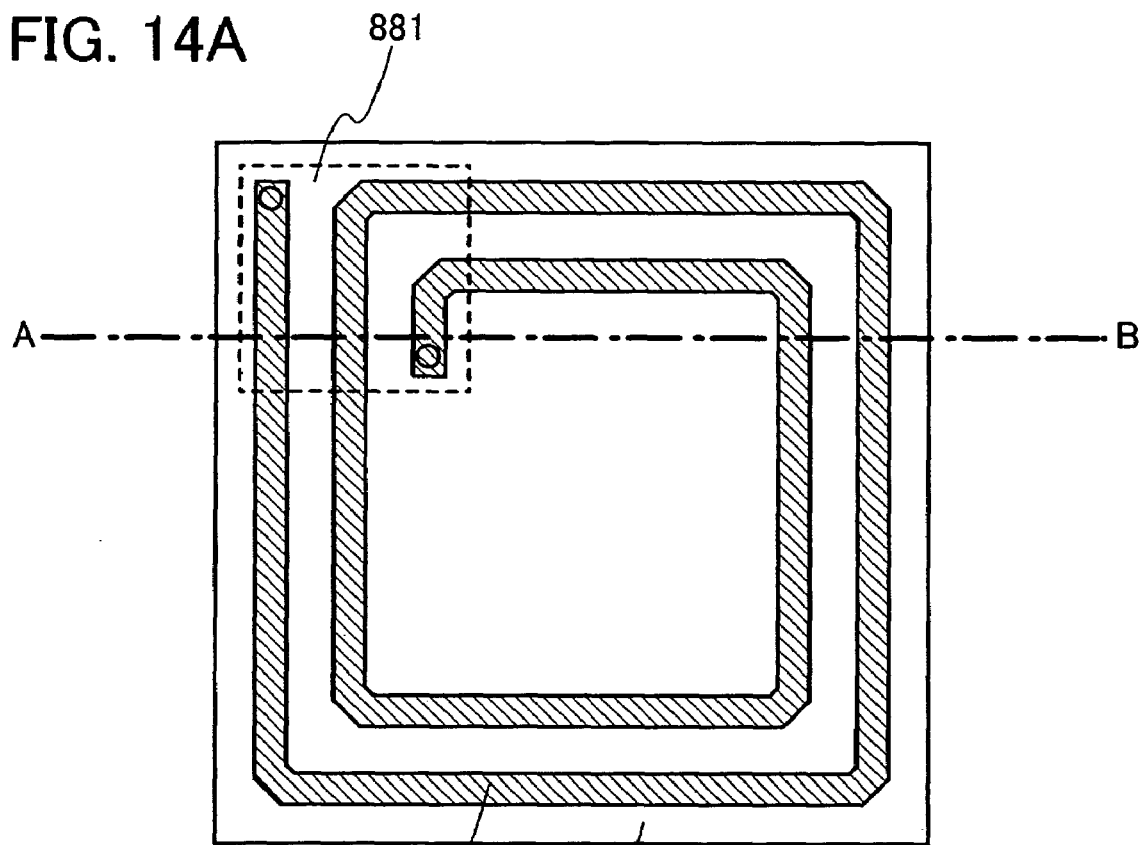
FIGS. 14A and 14B show a semiconductor device of the invention (Embodiment Mode 4).
Figure 14B:
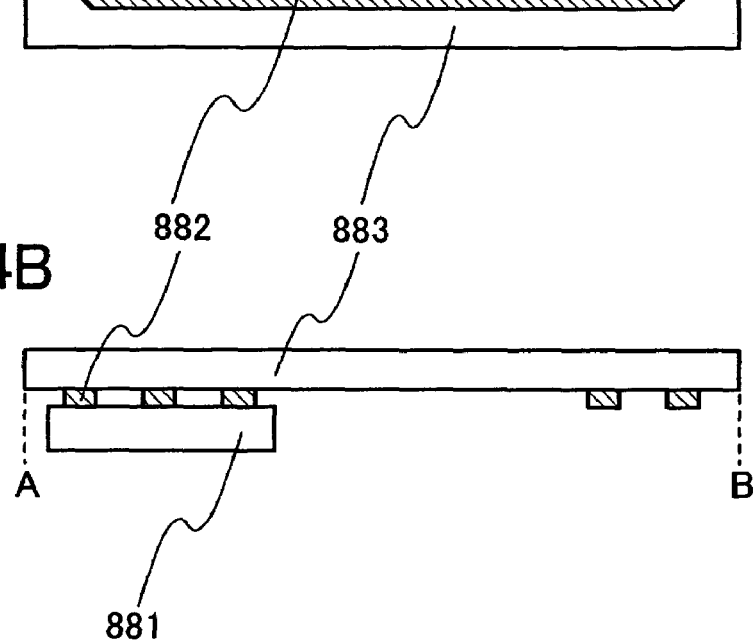

A structure of a semiconductor device using a loop antenna as one shape of the antenna is described using FIGS. 14A and 14B. FIG. 14A is a top view of the semiconductor device, and FIG. 14B is a cross-sectional view along line A-B in FIG. 14A.

An element formed inside a layer to be transposed 881 formed over a laminated film is electrically connected to a loop antenna 882 provided over a base member 883. The width of the loop antenna 882 may be preferably uniform. In addition, the shape of the loop antenna 882 may be the shape having a triangular cutout at each bending portion as shown in FIG. 14A, which is preferable in that current can easily flow. The same effect can also be obtained in the case of the shape where the bending portion has curvature (a rounded shape). Further, the base member 883 and the element formed inside the layer to be transposed 881 may be preferably sealed as required with two pieces of laminated films.

Figure 15A:
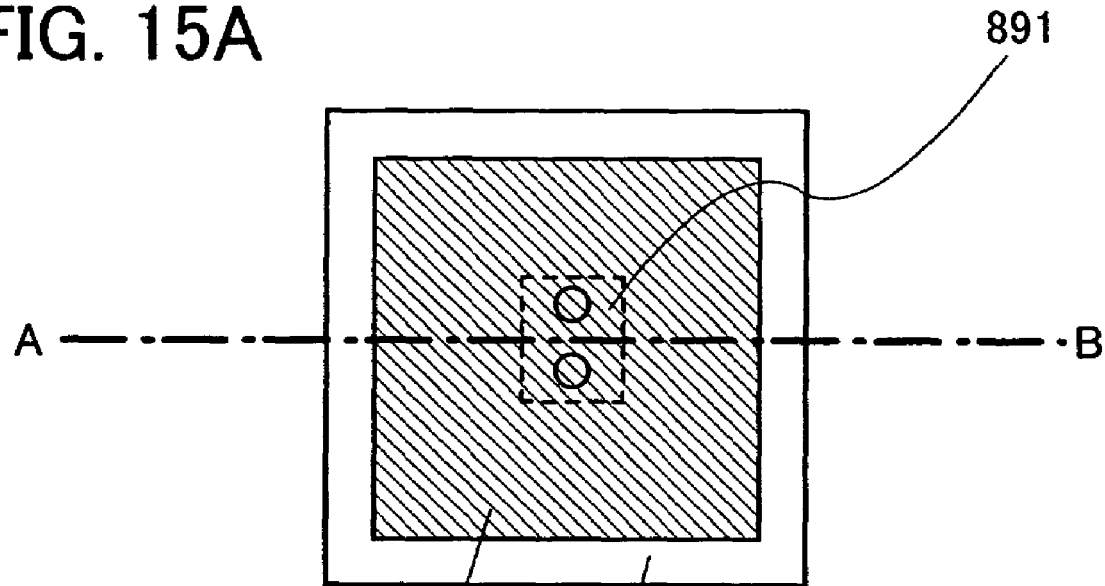
FIGS. 15A and 15B show a semiconductor device of the invention (Embodiment Mode 4).
Figure 15B:
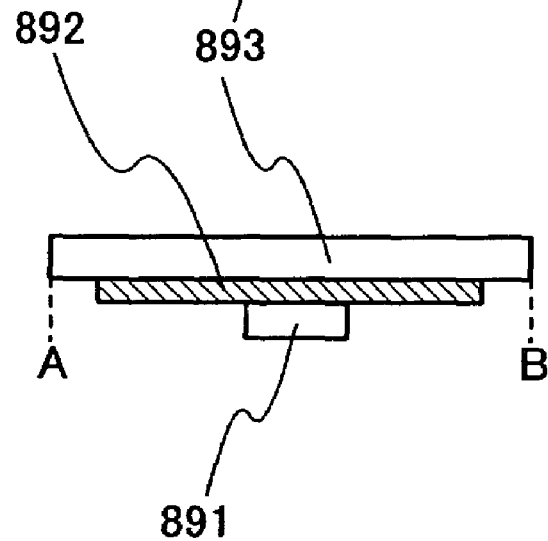

A structure of a semiconductor device using a patch antenna as one shape of the antenna is described using FIGS. 15A and 15B. FIG. 15A is a top view of the semiconductor device, and FIG. 15B is a cross-sectional view along line A-B in FIG. 15A.

An element formed inside a layer to be transposed 891 formed over a laminated film is electrically connected to a patch antenna 892 provided over a base member 893. Further, the base member 893 and the element formed inside the layer to be transposed 891 may be preferably sealed as required with two pieces of laminated films.

As described above, in the present invention, a layer to be transposed is formed in a groove which is formed in a substrate, and the substrate is ground and polished until a bottom surface of the groove is exposed, so that a semiconductor device which is thinner than a conventional one can be provided.

It is to be noted that this embodiment mode can be implemented combining freely with the above-described embodiment modes. That is, the materials of the antennas and the structures of the layers to be transposed described in this embodiment mode can use those described in the above-described embodiment modes.

Embodiment Mode 5

Figure 16A:
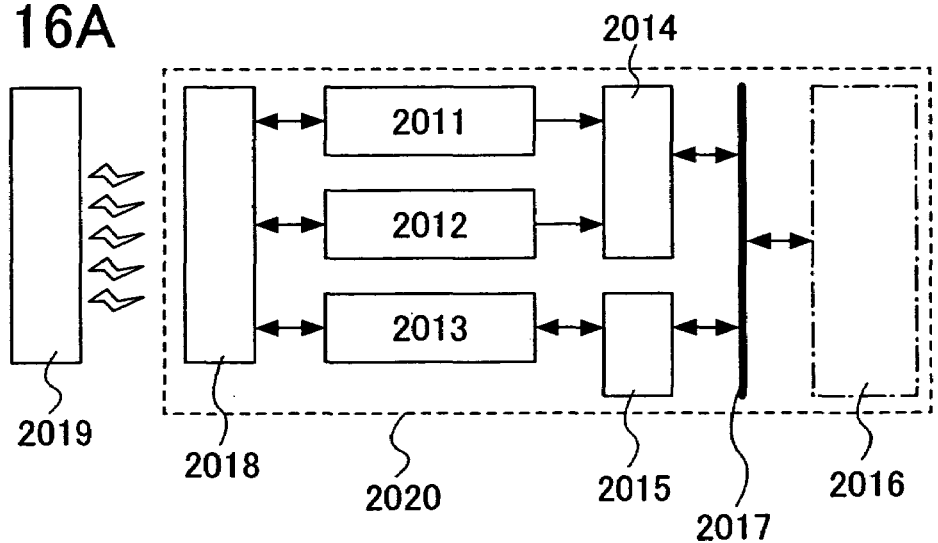
FIGS. 16A to 16C show a semiconductor device of the invention and an application way thereof (Embodiment Mode 5).
Figure 16B:
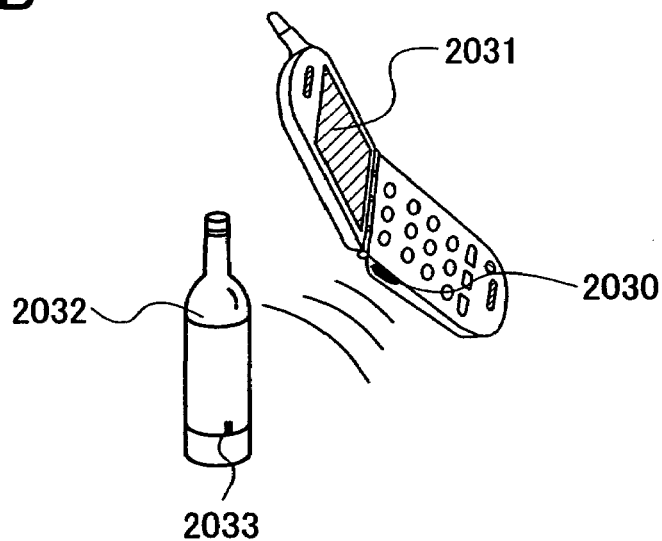
Figure 16C:
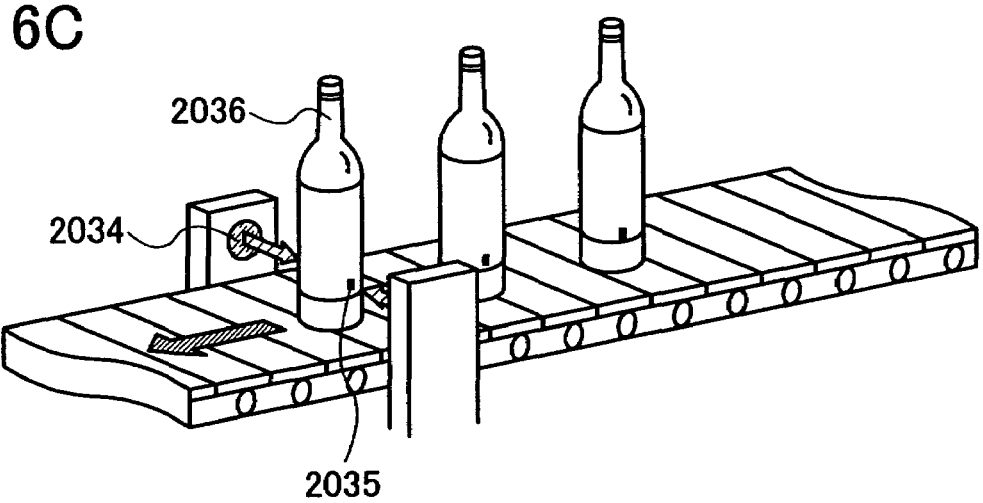

In this embodiment mode, one embodiment mode of the case where the semiconductor device manufactured using the present invention, which is thinner than a conventional one, is utilized as an RFID tag capable of transmitting and receiving data without contact is described using FIGS. 16A to 16C.

An RFID tag 2020 has a function to exchange data without contact, and includes a power source circuit 2011, a clock generating circuit 2012, a data modulation/demodulation circuit 2013, a control circuit 2014 which controls another circuit, an interface circuit 2015, a memory 2016, a data bus 2017, and an antenna (an antenna coil) 2018 (FIG. 16A).

The power source circuit 2011 is a circuit for generating various power sources to be supplied to the respective circuits in the semiconductor device, based on an alternating signal inputted from the antenna 2018. The clock generating circuit 2012 is a circuit for generating various clock signals to be supplied to the respective circuits in the semiconductor device, based on an alternating signal inputted from the antenna 2018. The data modulation/demodulation circuit 2013 has a function to modulate/demodulate data to exchange with a reader/writer 2019. The control circuit 2014 has a function to control the memory 2016. The antenna 2018 has a function to transmit and receive an electromagnetic wave. The reader/writer 2019 exchanges data with the semiconductor device, and controls the process of the data. The RFID tag is not limited to the above structure, and for example, another element such as a limiter circuit of power source voltage or hardware only for processing codes may be added in the structure.

Further, in the RFID tag, power supply voltage to each circuit may be supplied by electric waves without using a power supply (a battery), by using a power supply (a battery) without using electric waves, or by electric waves and a power supply.

It is advantageous to utilize the semiconductor device of the present invention for an RFID tag or the like, in the following points: non-contact communication is possible; multiple reading is possible; writing of data is possible; processing into various shapes is possible; directivity is wide and a wide recognition range is provided depending on the selected frequency; and the like. The RFID tag can be applied to an IC tag which can identify individual information of a person or an article with non-contact wireless communication, a label which can be attached to an objective article by label processing, a wristband for an event or an amusement, or the like. The RFID tag may be processed for shaping by using a resin material or may be directly fixed to metal which obstructs wireless communication. Further, the RFID tag can be utilized for the operation of a system such as an entering-leaving management system, a settlement system, or a check-out system of a CD (Compact Disc), a DVD (Digital versatile Disc), an HD DVD (High Definition DVD), or a BD (Blu-ray Disc).

Next, one mode of actually using the semiconductor device of the present invention as an RFID tag is described. A reader/writer 2030 is provided on a side of a portable terminal including a display area 2031, and an RFID tag 2033 is provided on a side of an article 2032 (FIG. 16B). In the RFID tag 2033 manufactured in accordance with the present invention, moisture or a substance causing contamination can be prevented from entering, and thus, chemical and physical strength and circumstance resistance are excellent. When the reader/writer 2030 is held toward the RFID tag 2033 provided on the article 2032, information related to the article, such as a raw material and a place of origin of the article, a test result in each production process, a history of distribution process, or further, description of the article is displayed on the display area 2031. In addition, a product 2036 can be inspected by using a reader/writer 2034 and an RFID tag 2035 provided on the product 2036 during the product 2036 is transferred on a conveyor belt (FIG. 16C). In this manner, by utilizing the RFID tag manufactured in accordance with the present invention for a system, information can be easily obtained, and higher function and high added value can be realized at low cost.

This embodiment can be implemented combining freely with the above-described embodiment modes.

Embodiment Mode 6

The semiconductor device of the invention can be utilized as an RFID tag. For example, it can be used with being provided for a bill, a coin, securities, a certificate, a bearer bond, a container for wrapping, a book, a storage medium, personal belongings, a vehicle, food, a garment, a health product, a daily commodity, medicine, an electronic device, or the like. A specific example thereof will be described using FIGS. 17A to 17H. The RFID tag is denoted by 2720 in FIGS. 17A to 17H. The RFID tag manufactured in accordance with the invention, which has flexibility and is thinner than a conventional one, can be attached to (embedded into) the above-described objects having various shapes.

Figure 17A:
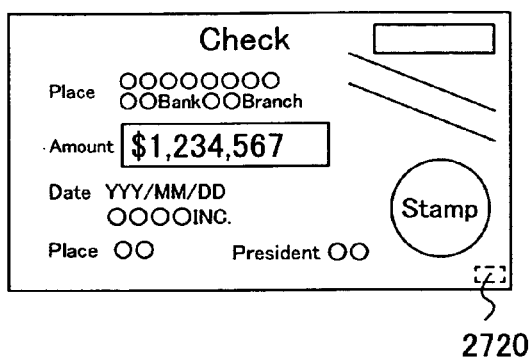
FIGS. 17A to 17H show an application way of a semiconductor device of the invention (Embodiment Mode 6).
Figure 17B:
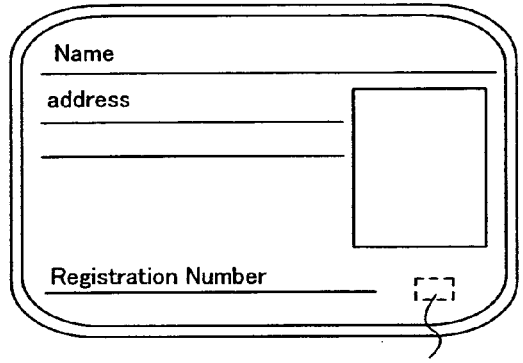
Figure 17C:
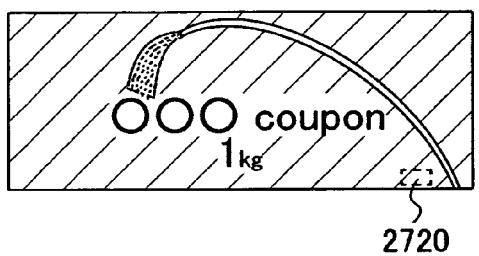
Figure 17D:
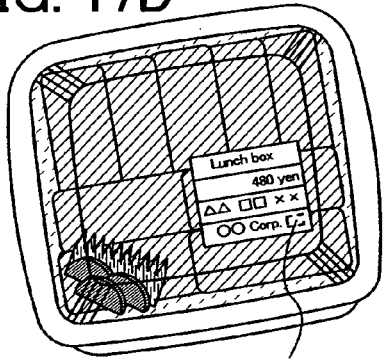
Figure 17E:
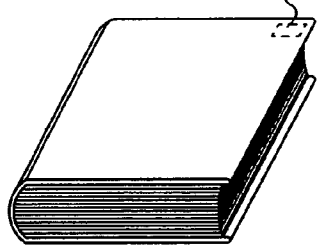
Figure 17F:
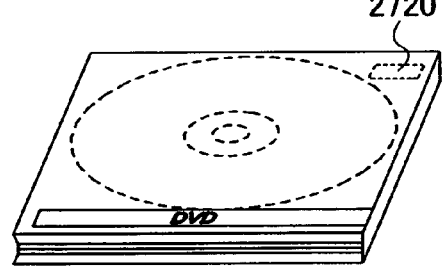
Figure 17G:
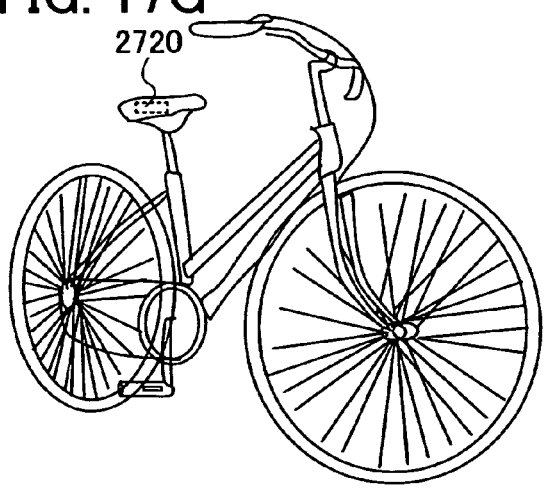
Figure 17H:
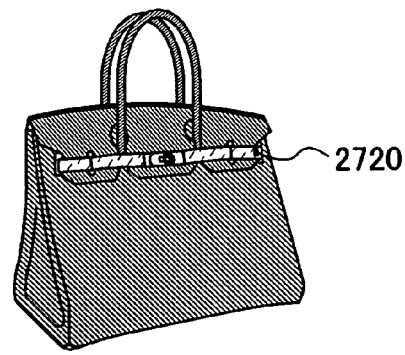

The bills and coins are money that circulates in the market, and includes one that can be used in the same way as money in a specific area (cash voucher), a commemorative coin, and the like. The securities indicate a check, a certificate, a promissory note, and the like (FIG. 17A). The certificates indicate a driver's license, a resident's card, and the like (FIG. 17B). The bearer bonds indicate a stamp, a food coupon, a gift coupon, and the like (FIG. 17C). The containers for wrapping indicate a wrapper for a packed lunch, a plastic bottle, and the like (FIG. 17D). The books indicates a volume, a book, and the like (FIG. 17E). The storage mediums indicate a DVD (Digital Versatile Disc), an HD DVD (High Definition DVD), or a BD (Blu-ray Disc), a video tape, and the like (FIG. 17F). The vehicles indicate a wheeled vehicle such as a bicycle, a marine vessel, and the like (FIG. 17G). The personal belongings indicate a bag, glasses, and the like (FIG. 17H). The food indicates foods, beverages, and the like. The garments indicate clothes, shoes, and the like. The health products indicate a medical apparatus, a health appliance, and the like. The daily commodities indicate furniture, lighting apparatus, and the like. The medicine indicates a medical drug, an agricultural chemical, and the like. The electronic devices indicate a liquid crystal display device, an EL display device, a television apparatus (a television receiver or a thin television receiver), a cellular phone, and the like.

By providing the RFID tag for bills, coins, securities, certificates, bearer bonds, or the like, forgery can be prevented. By providing the RFID tag for containers for wrapping, books, storage mediums, personal belongings, food, daily commodities, electronic devices, or the like, an inspection system, a system at a rental shop, or the like can be facilitated. By providing the RFID tag for vehicles, health products, medicines, or the like, forgery or theft can be prevented and a medical drug is prevented from being taken improperly. The RFID tag is provided by being attached to a surface of the object, or being embedded into the object. For example, the RFID tag wireless chip may be embedded into paper of a book, or may be embedded into an organic resin of a package formed of the organic resin.

In this manner, by providing the RFID tag for containers for wrapping, storage mediums, personal belongings, food, garments, daily commodities, electronic devices, or the like, an inspection system, a system at a rental shop, or the like can be facilitated. Further, by providing the RFID tag for vehicles, forgery or theft can be prevented. Further, by embedding the RFID tag into a creature such as an animal, each creature can be easily identified; for example, by embedding the RFID tag into a creature such as a domestic animal, the first year of life, sex, breed or the like thereof can be easily identified.

As described above, the semiconductor device of the invention can be provided for any object to use. This embodiment mode can be implemented combining freely with the above-described embodiment modes.

This application is based on Japanese Patent Application serial no. 2005-321525 filed in Japan Patent Office on 4th, Nov., 2005, the entire contents of which are hereby incorporated by reference.

What is claimed is:

1. A manufacturing method of a semiconductor device, comprising:
   forming a plurality of grooves in one surface of a substrate;
   forming an element layer including a plurality of elements which are disposed within the plurality of grooves;
   thinning the substrate from the other surface of the substrate until a surface of the element layer is exposed, to form a plurality of layers which are to be transposed, each having at least one of the plurality of elements;
   transposing the plurality of layers onto a film;
   cutting the film so that the plurality of layers are separated from each other; and
   attaching one of the plurality of layers to a base member provided with an antenna so that at least one of the plurality of elements and the antenna are electrically connected to each other.

2. The manufacturing method of a semiconductor device according to claim 1, wherein depth of each of the plurality of grooves is within the range of 2 μm to 100 μm inclusive.

3. The manufacturing method of a semiconductor device according to claim 1, wherein an opening portion of each of the plurality of grooves is rectangular in shape.

4. The manufacturing method of a semiconductor device according to claim 1, wherein an opening portion of each of the plurality of grooves is square in shape, and length per side of the square is within the range of 0.5 mm to 25 mm inclusive.

5. The manufacturing method of a semiconductor device according to claim 1, wherein a glass substrate or a silicon substrate is used as the substrate.

6. A manufacturing method of a semiconductor device, comprising:
   forming a groove in one surface of a substrate;
   forming an element layer including an element, the element being disposed within the groove;
   thinning the substrate from the other surface of the substrate until a surface of the element layer is exposed, to form a layer which is to be transposed, having the element;
   transposing the layer having the element onto a film; and
   attaching the layer having the element to a base member provided with an antenna so that the element and the antenna are electrically connected to each other.

7. The manufacturing method of a semiconductor device according to claim 6, wherein an opening portion of the groove is rectangular in shape.

8. The manufacturing method of a semiconductor device according to claim 6, wherein an opening portion of the groove is square in shape, and length per side of the square is within the range of 0.5 mm to 25 mm inclusive.

9. The manufacturing method of a semiconductor device according to claim 6, wherein a glass substrate or a silicon substrate is used as the substrate.

10. A manufacturing method of a semiconductor device, comprising:

forming a groove in one surface of a substrate;

forming an element layer including an element, the element being disposed within the groove;

attaching a first film to the element layer;

thinning the substrate from the other surface of the substrate until a surface of the element layer is exposed, to form a layer which is to be transposed, having the element;

selectively reducing an adhesibility between the first film and the layer which is to be transposed;

transposing the layer having the element onto a second film; and attaching the layer having the element to a base member provided with an antenna so that the element and the antenna are electrically connected to each other.

11. The manufacturing method of a semiconductor device according to claim 10, wherein an opening portion of the groove is rectangular in shape.

12. The manufacturing method of a semiconductor device according to claim 10, wherein an opening portion of the groove is square in shape, and length per side of the square is within the range of 0.5 mm to 25 mm inclusive.

13. The manufacturing method of a semiconductor device according to claim 10, wherein a glass substrate or a silicon substrate is used as the substrate.

* * * * *